United States Patent
Kobayashi et al.

(10) Patent No.: US 11,869,701 B2
(45) Date of Patent: Jan. 9, 2024

(54) CIRCUIT ELEMENT

(71) Applicant: Murata Manufacturing Co., Ltd., Nagaokakyo (JP)

(72) Inventors: Hideaki Kobayashi, Nagaokakyo (JP); Kentaro Mikawa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 299 days.

(21) Appl. No.: 17/495,849

(22) Filed: Oct. 7, 2021

(65) Prior Publication Data

US 2022/0028597 A1 Jan. 27, 2022

Related U.S. Application Data

(63) Continuation of application No. PCT/JP2020/013265, filed on Mar. 25, 2020.

(30) Foreign Application Priority Data

Jun. 4, 2019 (JP) .................. 2019-104700

(51) Int. Cl.
  *H02H 1/00* (2006.01)
  *H01F 27/28* (2006.01)
  (Continued)

(52) U.S. Cl.
  CPC ......... *H01F 27/2804* (2013.01); *H01F 27/29* (2013.01); *H01F 27/40* (2013.01);
  (Continued)

(58) Field of Classification Search
  None
  See application file for complete search history.

(56) References Cited

U.S. PATENT DOCUMENTS

2013/0009726 A1   1/2013 Sasaki
2017/0309402 A1*  10/2017 Yamashita ............ H01F 27/292
(Continued)

FOREIGN PATENT DOCUMENTS

JP   2000-134001 A   5/2000
JP   2010-141128 A   6/2010
(Continued)

OTHER PUBLICATIONS

Official Communication issued in International Patent Application No. PCT/JP2020/013265, dated Jun. 16, 2020.

*Primary Examiner* — Stephen W Jackson
(74) *Attorney, Agent, or Firm* — Keating & Bennett, LLP

(57) ABSTRACT

A circuit element includes a multilayer body including insulating substrates, a first coil conductor inside the multilayer body, and first and second outer electrodes and a ground electrode on outer surfaces of the multilayer body. The first coil conductor includes a winding axis extending in a stacking direction of the insulating substrates, the first coil conductor is connected to the first outer electrode, the second outer electrode, or the ground electrode, and the second outer electrode extends along a side surface of the multilayer body. An additional capacitance is generated between the second outer electrode and the first coil conductor. The second outer electrode includes first and second portions with different widths in a layer direction of the insulating substrates and the width of the second portion is larger than the width of the first portion.

19 Claims, 16 Drawing Sheets

(51) Int. Cl.
  *H01F 27/29* (2006.01)
  *H01F 27/40* (2006.01)
  *H01F 41/04* (2006.01)
  *H01G 4/40* (2006.01)

(52) U.S. Cl.
  CPC ............ *H01F 41/043* (2013.01); *H01G 4/40* (2013.01); *H01F 2027/2809* (2013.01)

(56) References Cited

U.S. PATENT DOCUMENTS

2018/0308617 A1* 10/2018 Ha .................. H01F 17/0013
2019/0115143 A1* 4/2019 Tachibana ............ H01F 27/292
2019/0288659 A1* 9/2019 Oishi ................ H01F 17/0013

FOREIGN PATENT DOCUMENTS

| JP | 2013-021449 A | 1/2013 |
|----|---------------|--------|
| JP | 2014-053765 A | 3/2014 |

\* cited by examiner

CIRCUIT ELEMENT

CROSS REFERENCE TO RELATED APPLICATIONS

This application claims the benefit of priority to Japanese Patent Application No. 2019-104700 filed on Jun. 4, 2019 and is a Continuation Application of PCT Application No. PCT/JP2020/013265 filed on Mar. 25, 2020. The entire contents of each application are hereby incorporated herein by reference.

BACKGROUND OF THE INVENTION

1. Field of the Invention

The present invention relates to a circuit element that includes coil conductors inside a multilayer body including insulating layers, or to a circuit element that includes capacitor electrodes inside a multilayer body.

2. Description of the Related Art

An effective way to increase the density of a high-frequency circuit is to provide a filter using an LC composite component. For example, Japanese Unexamined Patent Application Publication No. 2013-21449 discloses a circuit element used as a filter that includes an inductor and a capacitor in a multilayer body formed by stacking insulating layers.

For example, when an LC low-pass filter includes the above LC composite component, the lower the cut-off frequency, the larger the inductance of the inductor or the larger the capacitance of the capacitor. Therefore, there is a problem that the required number of insulating substrate layers is increased, and it becomes impossible to achieve a low height and to increase the density of a high-frequency circuit.

In addition, even when a capacitor having a relatively small capacitance is provided, there is a problem that consequently the number of insulating substrate layers is increased and it is necessary to secure areas in which to form the capacitor electrodes, and the density of a high-frequency circuit cannot be increased.

SUMMARY OF THE INVENTION

Preferred embodiments of the present invention provide small-sized circuit elements that are each able to increase densities of high-frequency circuits.

A circuit element according to a preferred embodiment of the present invention includes a multilayer body including insulating substrates, a first coil conductor inside the multilayer body, and a first outer electrode and a second outer electrode on an outer surface of the multilayer body. The first coil conductor includes a winding axis extending in a stacking direction of the insulating substrates. The first coil conductor is connected to the first outer electrode or the second outer electrode. The second outer electrode extends along a side surface of the multilayer body. An additional capacitance is generated between the second outer electrode and the first coil conductor due to the second outer electrode and the first coil conductor being adjacent to or within a vicinity of each other. The second outer electrode includes a first portion and a second portion that have different widths from each other in a layer direction of the insulating substrates. The width of the second portion is larger than the width of the first portion.

A circuit element according to a preferred embodiment of the present invention includes a multilayer body including insulating substrates, a third capacitor electrode and a fourth capacitor electrode inside the multilayer body and facing each other, and a first outer electrode, a second outer electrode, and a ground electrode on an outer surface of the multilayer body. The third capacitor electrode or the fourth capacitor electrode is connected to the first outer electrode, the second outer electrode, or the ground electrode. The second outer electrode extends along a side surface of the multilayer body. An additional capacitance is generated between the second outer electrode and the third capacitor electrode due to the second outer electrode and the third capacitor electrode being adjacent to or within a vicinity of each other.

A circuit element according to a preferred embodiment of the present invention includes a multilayer body including insulating substrates, a first outer electrode, a second outer electrode, and a ground electrode on an outer surface of the multilayer body, a seventh capacitor electrode and an eighth capacitor electrode inside the multilayer body and facing each other, and a third coil conductor and a fourth coil conductor inside the multilayer body. A third coil including the third coil conductor and a fourth coil including the fourth coil conductor are connected in series between the first outer electrode and the second outer electrode. The eighth capacitor electrode is connected to the ground electrode and the seventh capacitor electrode is connected to the first outer electrode. The ground electrode extends along a side surface of the multilayer body. An additional capacitance is generated between the seventh capacitor electrode and the ground electrode due to the ground electrode and the seventh capacitor electrode being adjacent to or within a vicinity of each other.

The second outer electrode includes a first portion and a second portion that have different widths from each other in a layer direction of the insulating substrates. The width of the second portion is larger than the width of the first portion.

According to preferred embodiments of the present invention, an additional capacitance can be generated in order to finely adjust a desired capacitance without increasing the number of insulating substrate layers and without securing areas in which to provide capacitor electrodes on the insulating substrates, and therefore small-sized circuit elements that are each able to increase the density of high-frequency circuits can be obtained.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
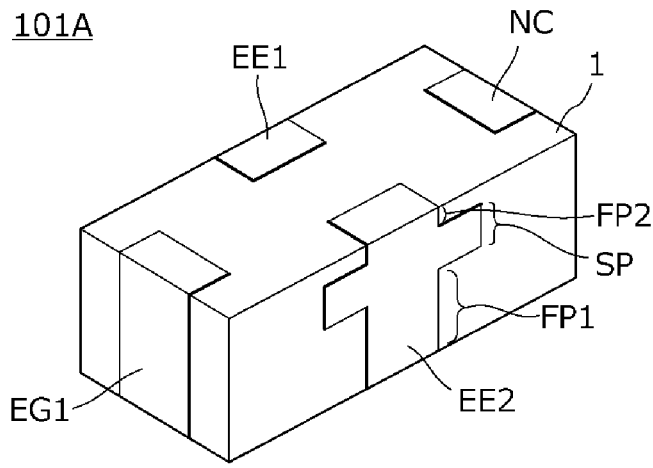
FIG. 1 is a perspective view of a circuit element 101A according to a First Preferred Embodiment of the present invention.

Hereafter, preferred embodiments of the present invention will be described with reference to specific examples and the drawings. The same or corresponding portions and elements are denoted by the same symbols in the drawings. Taking explanation of important points or ease of understanding into account, the preferred embodiments are described in a separate manner for convenience of description, but portions of the configurations illustrated in different preferred embodiments may be substituted for one another or combined with one another. In the second preferred embodiment and preferred embodiments thereafter, description of matters common to the first preferred embodiment is omitted and only the differences are described. In particular, the same advantageous operational effects resulting from the same or similar configurations are not repeatedly described in the individual preferred embodiments.

First Preferred Embodiment

FIG. 1 is a perspective view of a circuit element 101A according to a First Preferred Embodiment of the present invention. The circuit element 101A includes a rectangular-parallelepiped-shaped multilayer body 1 in which a plurality of insulating substrates are stacked. A first outer electrode EE1, a second outer electrode EE2, and a ground electrode EG1 are provided on outer surfaces of the multilayer body 1. In this example, an unused terminal electrode NC is provided. This unused terminal electrode NC is mainly provided as a surface mount electrode and is not directly connected to circuit elements inside the multilayer body 1, such as first coil conductors L11, L12, L13, and L14, which are described later. In FIG. 1, axes parallel or substantially parallel to the sides of the multilayer body 1 represent coordinate axes as X, Y, and Z axes.

The second outer electrode EE2 includes first portions FP1 and FP2 and a second portion SP that have different widths from each other in a layer direction of the insulating substrates (widths in a direction along X-Y plane) (width in direction parallel or substantially parallel to X axis in the example illustrated in FIG. 1). The width of the second portion SP is larger than the widths of the first portions FP1 and FP2. The second portion SP faces the sides of some of first coil conductors described later.

Figure 2:
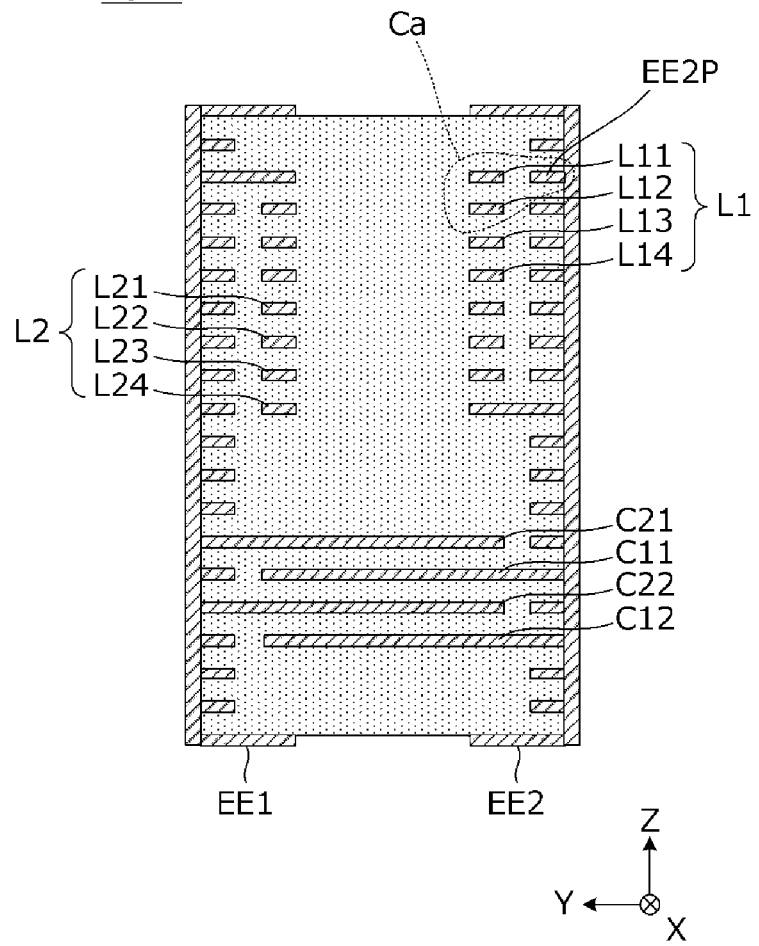
FIG. 2 is a sectional view taken along a plane that is parallel or substantially parallel to a Y-Z plane and passes through the center of the circuit element 101A.

FIG. 2 is a sectional view taken along a plane that is parallel or substantially parallel to a Y-Z plane and passes through the center of the circuit element 101A. However, the magnification ratio in the Z-axis direction (stacking direction) is illustrated as being larger than that in the Y-axis direction. First coil conductors L11, L12, L13, and L14 and second coil conductors L21, L22, L23, and L24 are provided inside the multilayer body. Furthermore, first capacitor electrodes C11 and C12 and second capacitor electrodes C21 and C22 are provided inside the multilayer body 1.

Figure 3:
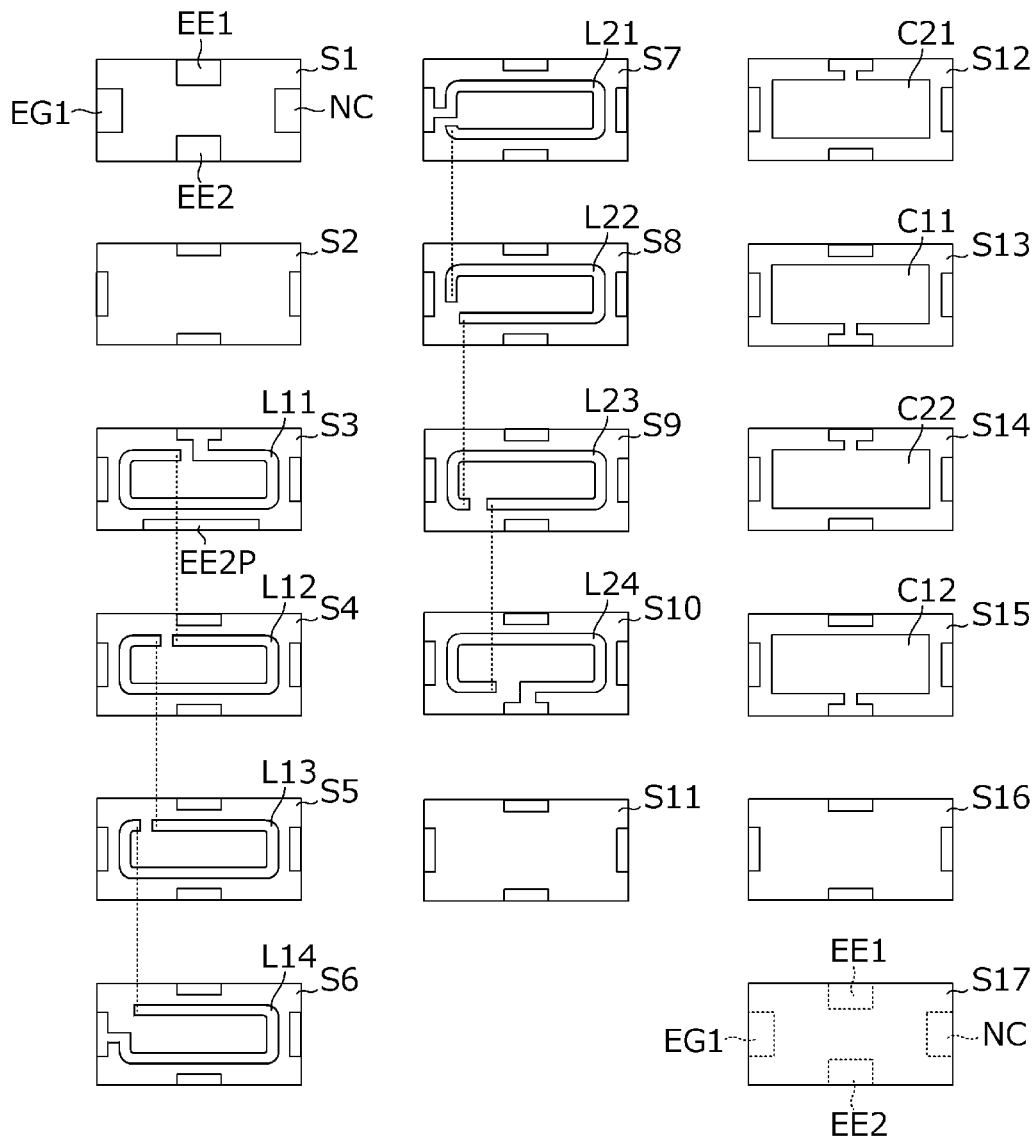
FIG. 3 is an exploded plan view illustrating conductor patterns provided on insulating substrates of the circuit element 101A.

FIG. 3 is an exploded plan view illustrating conductor patterns provided on insulating substrates of the circuit element 101A. An insulating substrate S1 is an uppermost insulating substrate and an insulating substrate S17 is a lowermost insulating substrate. Insulating substrates S2 to S16 are disposed therebetween. Portions of the first outer electrode EE1, the second outer electrode EE2, the ground electrode EG1, and the unused terminal electrode NC are provided on the upper surface of the insulating substrate S1 and the lower surface of the insulating substrate S17. As illustrated in FIG. 1, portions of the first outer electrode EE1, the second outer electrode EE2, the ground electrode EG1, and the unused terminal electrode NC are also provided on the four side surfaces of the multilayer body 1.

The first coil conductors L11, L12, L13, and L14 are respectively provided on the insulating substrates S3, S4, S5, and S6. In addition, the second coil conductors L21, L22, L23, and L24 are respectively provided on the insulating substrates S7, S8, S9, and S10. Dotted lines in FIG. 3 represent the positions of connections provided by via conductors. Although there are a plurality of each of the insulating substrates S11 and S16 on which no circuit conductor patterns are provided, only one of each is illustrated in FIG. 3.

A first end of the first coil conductor L11 is connected to the first outer electrode EE1. A via conductor, which connects a second end of the first coil conductor L11 and a first end of the first coil conductor L12 to each other, is provided in the insulating substrate S3. A via conductor, which connects a second end of the first coil conductor L12 and a first end of the first coil conductor L13 to each other, is provided in the insulating substrate S4. In addition, a via conductor, which connects a second end of the first coil conductor L13 and a first end of the first coil conductor L14 to each other, is provided in the insulating substrate S5. The second end of the first coil conductor L14 is connected to the ground electrode EG1. A first coil L1 is provided of the first coil conductors L11, L12, L13, and L14 and the via conductors.

A first end of the second coil conductor L21 is connected to the ground electrode EG1. A via conductor, which connects a second end of the second coil conductor L21 and a first end of the second coil conductor L22 to each other, is provided in the insulating substrate S7. A via conductor, which connects a second end of the second coil conductor L22 and a first end of the second coil conductor L23 to each other, is provided in the insulating substrate S8. In addition, a via conductor, which connects a second end of the second coil conductor L23 and a first end of the second coil conductor L24 to each other, is provided in the insulating substrate S9. A second end of the second coil conductor L24 is connected to the second outer electrode EE2. A second coil L2 is provided of the second coil conductors L21, L22, L23, and L24 and the via conductors.

The second capacitor electrodes C21 and C22 are respectively provided on the insulating substrates S12 and S14. In addition, the first capacitor electrodes C11 and C12 are respectively provided on the insulating substrates S13 and S15. A capacitor is provided by the first capacitor electrodes C11 and C12 and the second capacitor electrodes C21 and C22.

A large-width electrode EE2P that is electrically connected to the second portion SP illustrated in FIG. 1 is provided on the insulating substrate S3. The width of the large-width electrode EE2P in a direction parallel or substantially parallel to the X axis is the same or substantially the same as the width of the second portion SP. Thus, the large-width electrode EE2P and the second portion SP and the first coil conductors (in particular, the first coil conductors L11 and L12 and so on) face each other across a large width, and therefore an additional capacitance of a prescribed size is generated therebetween. In FIG. 2, this additional capacitance Ca is indicated by a dotted line.

Figure 4:
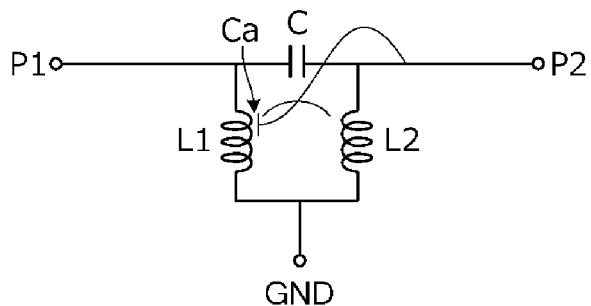
FIG. 4 is a circuit diagram of the circuit element 101A.

The additional capacitance increases the capacitance of a capacitor C generated between port P1 and port P2 illustrated in FIG. 4 by the prescribed additional capacitance Ca. As a result, a capacitor having a desired capacitance can be provided between the port P1 and the port P2.

Among the first coil conductors L11 to L14 provided across a plurality of layers, the second portion SP is preferably provided within a range of about ½ the height of the multilayer body in the stacking direction of the insulating substrates, for example. By restricting the area of the large-width second portion SP in this way, unwanted capacitances generated between the second portion SP and coil conductors that face the second portion SP are reduced or prevented and the formation of capacitors in unintended regions can be prevented. For example, in FIG. 2, there are no unnecessary additional capacitances Ca generated between the coil conductors L13 and L14, which are closer to the ground electrode among the first coil conductors L11 to L14, and the second outer electrode EE2.

FIG. 4 is a circuit diagram of the circuit element 101A. The circuit element 101A includes the first coil L1 including the first coil conductors L11, L12, L13, and L14, the second coil L2 including the second coil conductors L21, L22, L23, and L24, and the capacitor C including the first capacitor electrodes C11 and C12 and the second capacitor electrodes C21 and C22. The port P1 corresponds to the first outer electrode EE1 and the port P2 corresponds to the second outer electrode EE2. In addition, a ground GND corresponds to the ground electrode EG1.

A first end of the first coil L1 is connected to the first port P1 and the second end of the first coil L1 is connected to the ground GND. A first end of the second coil L2 is connected to the second port P2 and a second end of the second coil L2 is connected to the ground GND. The capacitor C is connected between the first port P1 and the second port P2.

The coil openings of the first coil conductors L11, L12, L13, and L14 and the coil openings of the second coil conductors L21, L22, L23, and L24 overlap when viewed in a direction parallel or substantially parallel to the Z axis (winding axes are aligned), and therefore the first coil L1 and the second coil L2 magnetically couple with each other.

The additional capacitance Ca is generated between the second port P2 and the first coil L1. In the present preferred embodiment, as illustrated in FIG. 2, the additional capacitance Ca is generated between the large-width electrode EE2P and the first coil conductors L11 and L12 of the first coil L1, which are located close to the position of a connection to the second outer electrode EE2. Therefore, the additional capacitance Ca is connected in parallel with the capacitor C and the capacitance of the capacitor C is increased by the additional capacitance Ca.

Figure 5:
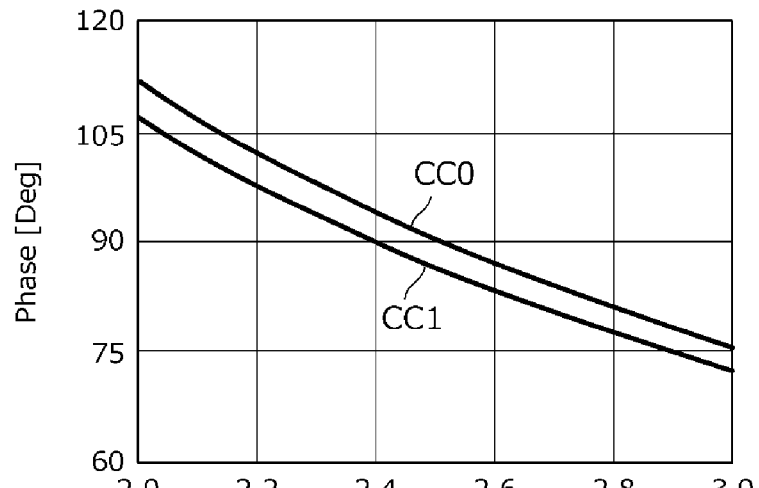
FIG. 5 is a diagram illustrating the frequency characteristics of a phase shift amount of the circuit element 101A.

FIG. 5 is a diagram illustrating the frequency characteristics of the phase shift amount of the circuit element 101A. The circuit illustrated in FIG. 4 operates as phase shifter having an L-C-L π-type circuit. In FIG. 5, the horizontal axis represents frequency and the vertical axis represents phase shift amount, and a characteristic curve CC1 represents the characteristic of the circuit element 101A of the present preferred embodiment and a characteristic curve CC0 represents the characteristic of a circuit element of a comparative example that does not include the additional capacitance Ca. In the comparative example, the required phase shift amount of 90° at 2.4 GHz is not obtained, whereas in the circuit element 101A of this preferred embodiment, a characteristic having a phase shift amount of 90° at 2.4 GHz is obtained.

Figure 6:
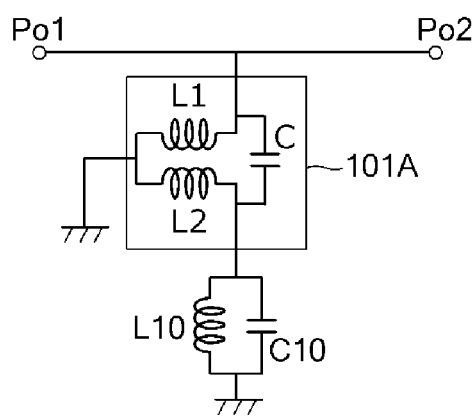
FIG. 6 is a circuit diagram illustrating a mode in which the circuit element 101A is used as a phase shifter inside a communication terminal device.

FIG. 6 is a circuit diagram illustrating a mode in which the circuit element 101A is used as a phase shifter inside a communication terminal device. In this example, there are two input/output terminals Po1 and Po2, a signal line connecting the two input/output terminals Po1 and Po2 to each other, and a series circuit including the circuit element 101A and an LC parallel resonance circuit connected along a shunt connection path between the signal line and ground. The LC parallel resonance circuit is a parallel circuit including an inductor L10 and a capacitor C10. The resonant frequency of the LC parallel resonance circuit is 2.4 GHz, for example.

In this example, the phase shift amount of the circuit element 101A is set to be 90° at 2.4 GHz. As a result of the series circuit consisting of the circuit element 101A and the LC parallel resonance circuit having a resonant frequency of 2.4 GHz being shunt connected between the signal line and ground, the impedance seen when looking at the shunt connection path from the signal line can be regarded as being that of a short circuit at 2.4 GHz. In other words, the shunt connection circuit operates as a 2.4 GHz trap filter.

This trap filter can, for example, selectively reduce or prevent a 2.4 GHz noise component generated by an amplifier connected to the signal line.

Even when the circuit is used as a trap filter, the additional capacitance Ca can be generated between the second port P2 and the first coil L1 by using the outer electrode as illustrated in FIG. 1 and the capacitance of capacitor C can be increased by the additional capacitance Ca.

Figure 7:
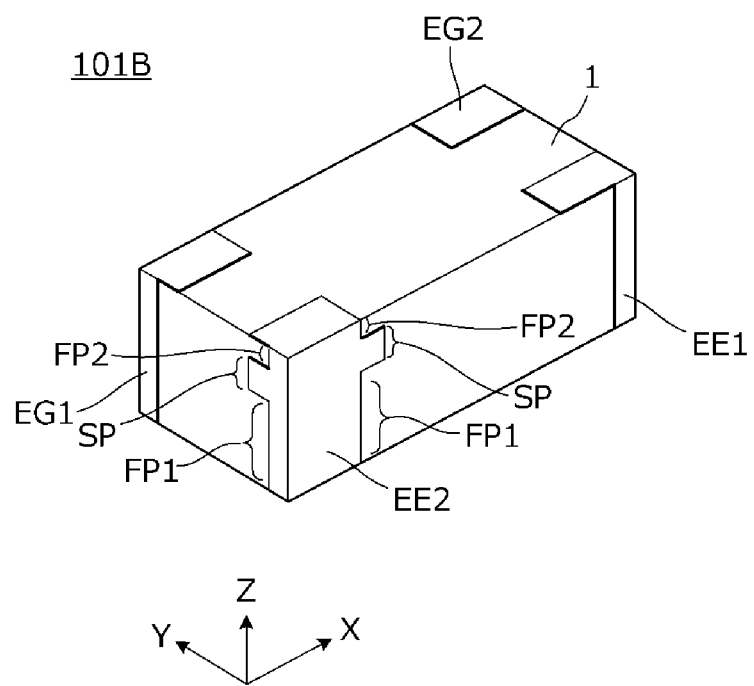
FIG. 7 is a perspective view of a circuit element 101B according to a First Preferred Embodiment of the present invention that is different from the example illustrated in FIG. 1.

FIG. 7 is a perspective view of a circuit element 101B according to a First Preferred Embodiment of the present invention that is different from the example illustrated in FIG. 1. This circuit element 101B includes a rectangular-parallelepiped-shaped multilayer body 1 in which a plurality of insulating substrates are stacked. A first outer electrode EE1, a second outer electrode EE2, and ground electrodes EG1 and EG2 are provided at the corners of side surfaces of the outer surfaces of the multilayer body 1.

The second outer electrode EE2 includes first portions FP1 and FP2 and a second portion SP that have different widths from each other in a layer direction of the insulating substrates (width in direction parallel or substantially parallel to X axis and width in direction parallel or substantially parallel to Y axis in example illustrated in FIG. 7). The width of the second portion SP is larger than the widths of the first portions FP1 and FP2. The second portion SP faces the corners of some of the first coil conductors as described later.

Figure 8:
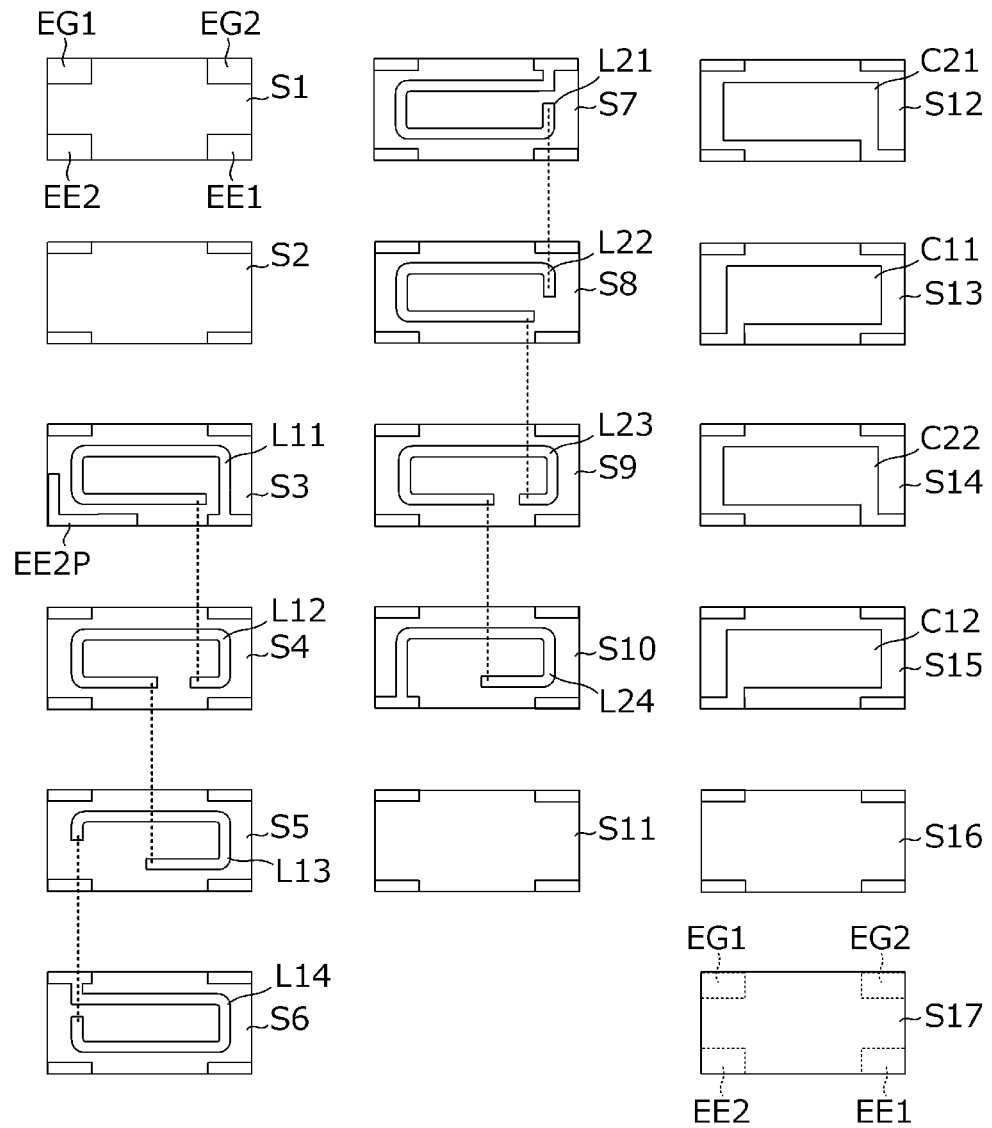
FIG. 8 is an exploded plan view illustrating conductor patterns provided on insulating substrates of the circuit element 101B.
Figure 8:
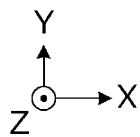

FIG. 8 is an exploded plan view illustrating conductor patterns provided on insulating substrates of the circuit element 101B. An insulating substrate S1 is an uppermost insulating substrate and an insulating substrate S17 is a lowermost insulating substrate. Insulating substrates S2 to S16 are disposed therebetween. The first outer electrode EE1, the second outer electrode EE2, and the ground electrodes EG1 and EG2 are provided on the upper surface of the insulating substrate S1 and the lower surface of the insulating substrate S17. As illustrated in FIG. 7, the first outer electrode EE1, the second outer electrode EE2, and the ground electrodes EG1 and EG2 are also provided on the side surfaces of the multilayer body 1.

A large-width electrode EE2P that is electrically connected to the second portion SP illustrated in FIG. 7 is provided on the insulating substrate S3. The width of the large-width electrode EE2P in a direction parallel or substantially parallel to the X axis and the width of the large-width electrode EE2P in a direction parallel or substantially parallel to the Y axis are the same or substantially the same as the respective widths of the second portion SP. Thus, the large-width electrode EE2P and the second portion SP and the first coil conductors (in particular, the first coil conductors L11 and L12 and so on) face each other across a large width, and therefore an additional capacitance of a prescribed size is generated therebetween.

In the First Preferred Embodiment, the large-width electrode EE2P and the second portion SP are provided at positions facing the first coil conductors L11 and L12 and are not provided at positions facing the capacitor electrodes C11, C12, C21, and C22 or at positions facing the second coil conductors L21, L22, L23, and L24. This reduces or prevents unwanted parasitic capacitances.

In the example described above, the first portions FP1 and FP2 and the second portion SP are provided for one outer electrode, but alternatively additional capacitances may be provided for first portions and a second portion having different widths from each other in a layer direction of the insulating substrates for a plurality of outer electrodes. Furthermore, outlines of the outer electrodes are not limited to those including lines parallel or substantially parallel to the X, Y, and Z axes in the three orthogonal axes coordinate system illustrated in FIGS. 1 and 7. For example, portions that are inclined from the three axes may be included in the outlines. Furthermore, round or curved lines may be included. Various variations may be used for the shapes of the outer electrodes. These points are not limited to the First Preferred Embodiment, and also apply to the other preferred embodiments described below.

Second Preferred Embodiment

In a Second Preferred Embodiment of the present invention, an example of a circuit element used as an LC filter is described.

Figure 9:
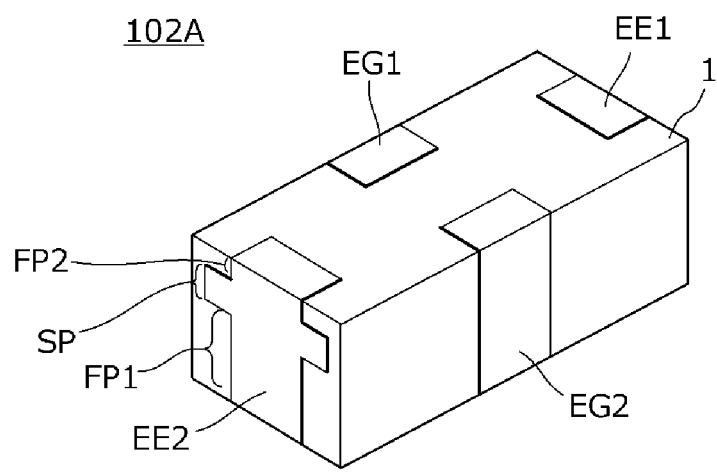
FIG. 9 is a perspective view of a circuit element 102A according to a Second Preferred Embodiment of the present invention.

FIG. 9 is a perspective view of a circuit element 102A according to the Second Preferred Embodiment. The circuit element 102A includes a rectangular-parallelepiped-shaped multilayer body 1 in which a plurality of insulating substrates are stacked. A first outer electrode EE1, a second outer electrode EE2, and ground electrodes EG1 and EG2 are provided on outer surfaces of the multilayer body 1.

The second outer electrode EE2 includes first portions FP1 and FP2 and a second portion SP that have different widths from each other in a layer direction of the insulating substrates (width in direction parallel or substantially parallel to Y axis in example illustrated in FIG. 9). The width of the second portion SP is larger than the widths of the first portions FP1 and FP2. The second portion SP faces the sides of some capacitor electrodes described later.

Figure 10:
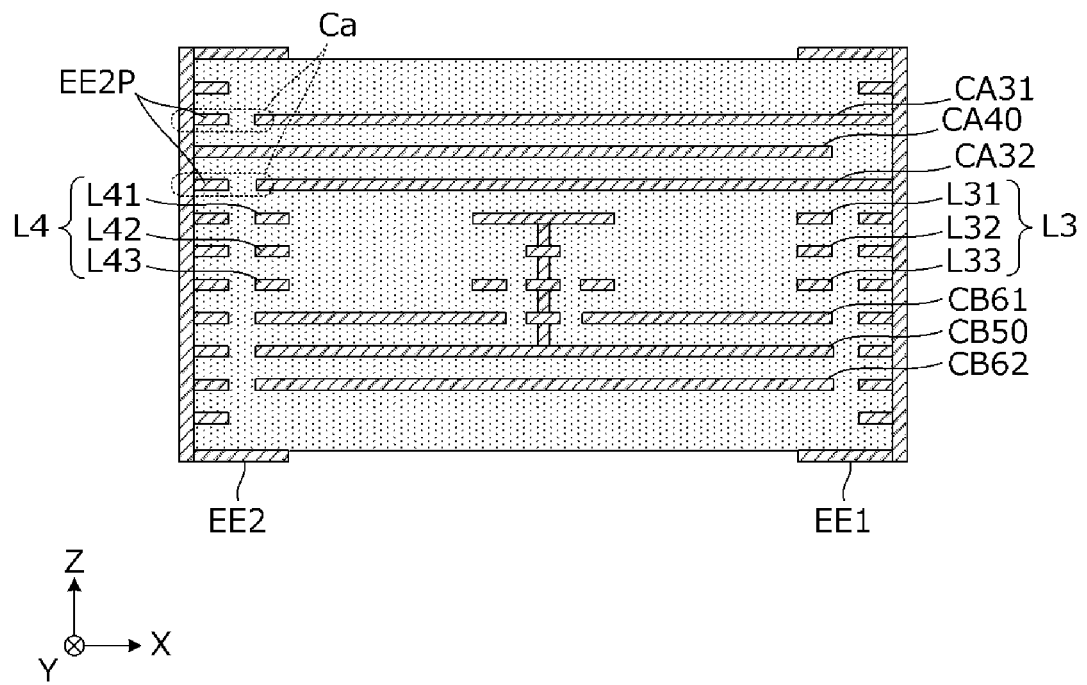
FIG. 10 is a sectional view taken along a plane that is parallel or substantially parallel to an X-Z plane and passes through the center of the circuit element 102A.

FIG. 10 is a sectional view taken along a plane that is parallel or substantially parallel to an X-Z plane and passes through the center of the circuit element 102A. Capacitor electrodes CA31, CA40, and CA32 and capacitor electrodes CB61, CB50, and CB62 are provided inside the multilayer body. In addition, third coil conductors L31, L32, and L33 and fourth coil conductors L41, L42, and L43 are provided inside the multilayer body 1.

Figure 11:
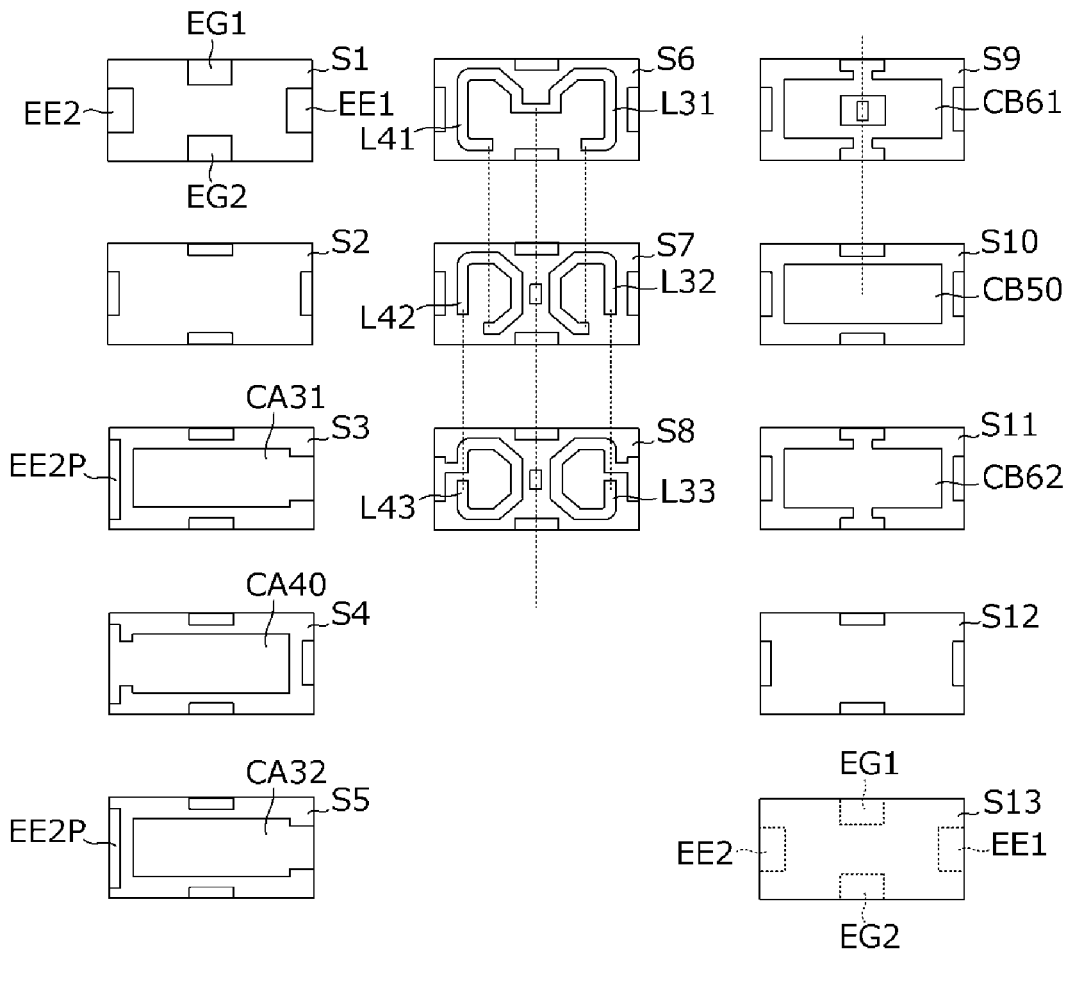
FIG. 11 is an exploded plan view illustrating conductor patterns provided on insulating substrates of the circuit element 102A.

FIG. 11 is an exploded plan view illustrating conductor patterns provided on insulating substrates of the circuit element 102A. An insulating substrate S1 is an uppermost insulating substrate and an insulating substrate S13 is a lowermost insulating substrate. Insulating substrates S2 to S12 are disposed therebetween. The first outer electrode EE1, the second outer electrode EE2, and the ground electrodes EG1 and EG2 are provided on the upper surface of the insulating substrate S1 and the lower surface of the insulating substrate S13. As illustrated in FIG. 9, the first outer electrode EE1, the second outer electrode EE2, and the ground electrodes EG1 and EG2 are also provided on the four side surfaces of the multilayer body 1.

Third capacitor electrodes CA31 and CA32 are respectively provided on the insulating substrates S3 and S5 and a fourth capacitor electrode CA40 is provided on the insulating substrate S4. In addition, sixth capacitor electrodes CB61 and CB62 are respectively provided on the insulating substrates S9 and S11 and a fifth capacitor electrode CB50 is provided on the insulating substrate S10. The third capacitor electrodes CA31 and CA32 are connected to the first outer electrode EE1 and the fourth capacitor electrode CA40 is connected to the second outer electrode EE2.

The third coil conductors L31, L32, and L33 are respectively provided on the insulating substrates S6, S7, and S8. In addition, similarly, the fourth coil conductors L41, L42, and L43 are respectively provided on the insulating substrates S6, S7, and S8. A first end of the third coil conductor L31 is connected to the capacitor electrode CB50 through a via conductor and a conductor pattern located at the position where the via conductor is provided. A via conductor, which connects a second end of the third coil conductor L31 and a first end of the third coil conductor L32 to each other, is provided in the insulating substrate S6. A via conductor, which connects a second end of the third coil conductor L32 and a first end of the third coil conductor L33 to each other, is provided in the insulating substrate S7. A second end of the third coil conductor L33 is connected to the first outer electrode EE1. A third coil L3 is provided of the third coil conductors L31, L32, and L33 and the via conductors. Similarly, a fourth coil L4 is provided of the fourth coil conductors L41, L42, and L43 and the via conductors.

Large-width electrodes EE2P that are electrically connected to the second portion SP illustrated in FIG. 9 are provided on the insulating substrates S3 and S5. The width of the large-width electrodes EE2P in a direction parallel or substantially parallel to the Y axis is the same or substantially the same as the width of the second part SP. Since the large-width electrodes EE2P and the second portion SP and the third capacitor electrodes CA31 and CA32 face each other across a large width in this way, an additional capacitance having a prescribed size is generated therebetween. In FIG. 10, the additional capacitance Ca is indicated by a dotted line.

Figure 12:
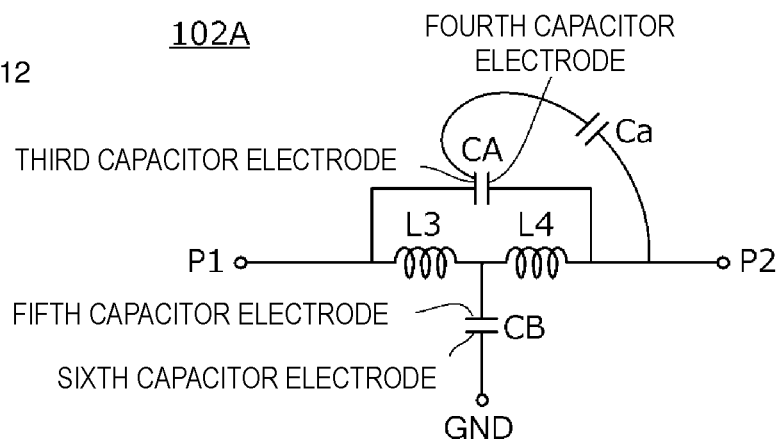
FIG. 12 is a circuit diagram of the circuit element 102A.

FIG. 12 is a circuit diagram of the circuit element 102A. The circuit element 102A includes the third coil L3 including the third coil conductors L31, L32, and L33 and the fourth coil L4 including the fourth coil conductors L41, L42, and L43. In addition, the circuit element 102A includes a capacitor CA formed of the third capacitor electrodes CA31 and CA32 and the fourth capacitor electrode CA40 and a capacitor CB including the fifth capacitor electrode CB50 and the sixth capacitor electrodes CB61 and CB62. The port P1 corresponds to the first outer electrode EE1 and the port P2 corresponds to the second outer electrode EE2. In addition, a ground GND corresponds to the ground electrodes EG1 and EG2.

The additional capacitance Ca is generated between the second port P2 and the third capacitor electrodes CA31 and CA32. Therefore, the additional capacitance Ca is connected in parallel with the capacitor CA and the capacitance of the capacitor C is increased by the additional capacitance Ca.

Figure 13:
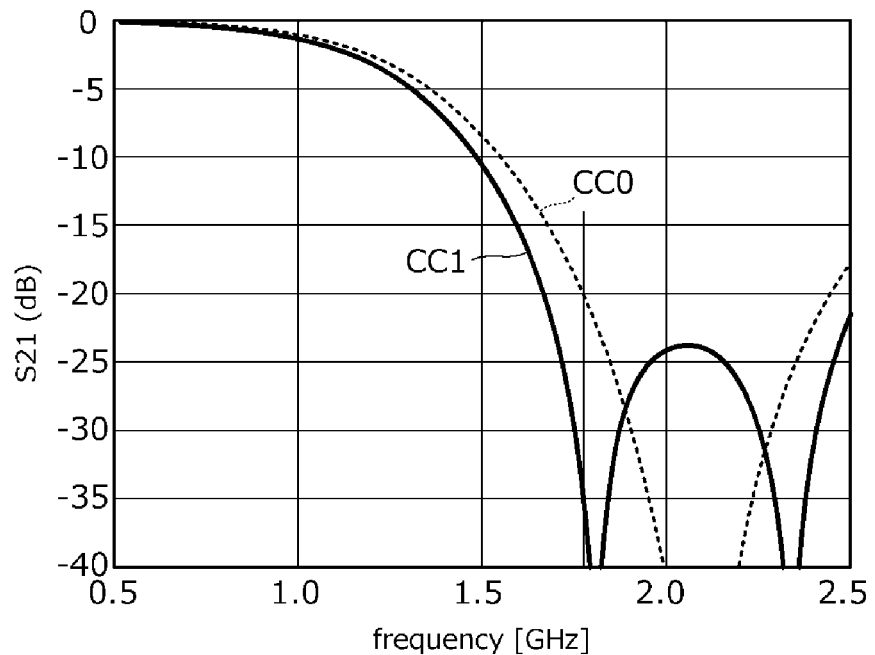
FIG. 13 is a diagram illustrating the frequency characteristics of the pass amplitude of the circuit element 102A.

FIG. 13 is a diagram illustrating the frequency characteristics of the pass amplitude of the circuit element 102A. The circuit illustrated in FIG. 12 operates as a low pass filter. In FIG. 13, the horizontal axis represents frequency and the vertical axis represents pass amplitude, and a characteristic curve CC1 represents the characteristic of the circuit element 102A of the present preferred embodiment and a characteristic curve CC0 represents the characteristic of a circuit element of a comparative example that does not include the additional capacitance Ca. In the comparative example, the pass amplitude required at about 1.78 GHz is about −20 dB, whereas in the circuit element 102A of the present preferred embodiment, the pass amplitude at about 1.78 GHz is less than or equal to about −36 dB.

By setting the capacitance of the capacitor CA, which is connected in parallel with the series circuit including the third coil L3 and the fourth coil L4, to a prescribed value, the LC parallel resonant frequency can be set to a prescribed frequency, and consequently, the attenuation from the pass region to the cut-off region can be made steeper.

Figure 14:
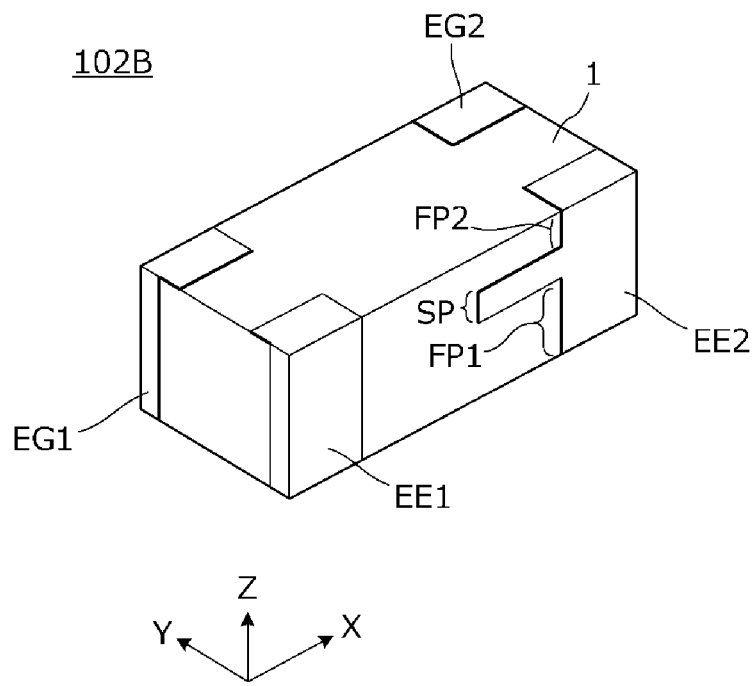
FIG. 14 is a perspective view of a circuit element 102B according to a Second Preferred Embodiment of the present invention that is different from the example illustrated in FIG. 9.

FIG. 14 is a perspective view of a circuit element 102B according to a Second Preferred Embodiment of the present invention that is different from the example illustrated in FIG. 9. This circuit element 102B includes a rectangular-parallelepiped-shaped multilayer body 1 in which a plurality of insulating substrates are stacked. A first outer electrode EE1, a second outer electrode EE2, and ground electrodes EG1 and EG2 are provided at the corners of side surfaces of the outer surfaces of the multilayer body 1.

The second outer electrode EE2 includes first portions FP1 and FP2 and a second portion SP that have different widths from each other in a layer direction of the insulating substrates (width in direction parallel or substantially parallel to X axis in example illustrated in FIG. 14). The width of the second portion SP is larger than the widths of the first portions FP1 and FP2. The second portion SP faces some capacitor electrodes described later.

Figure 15:
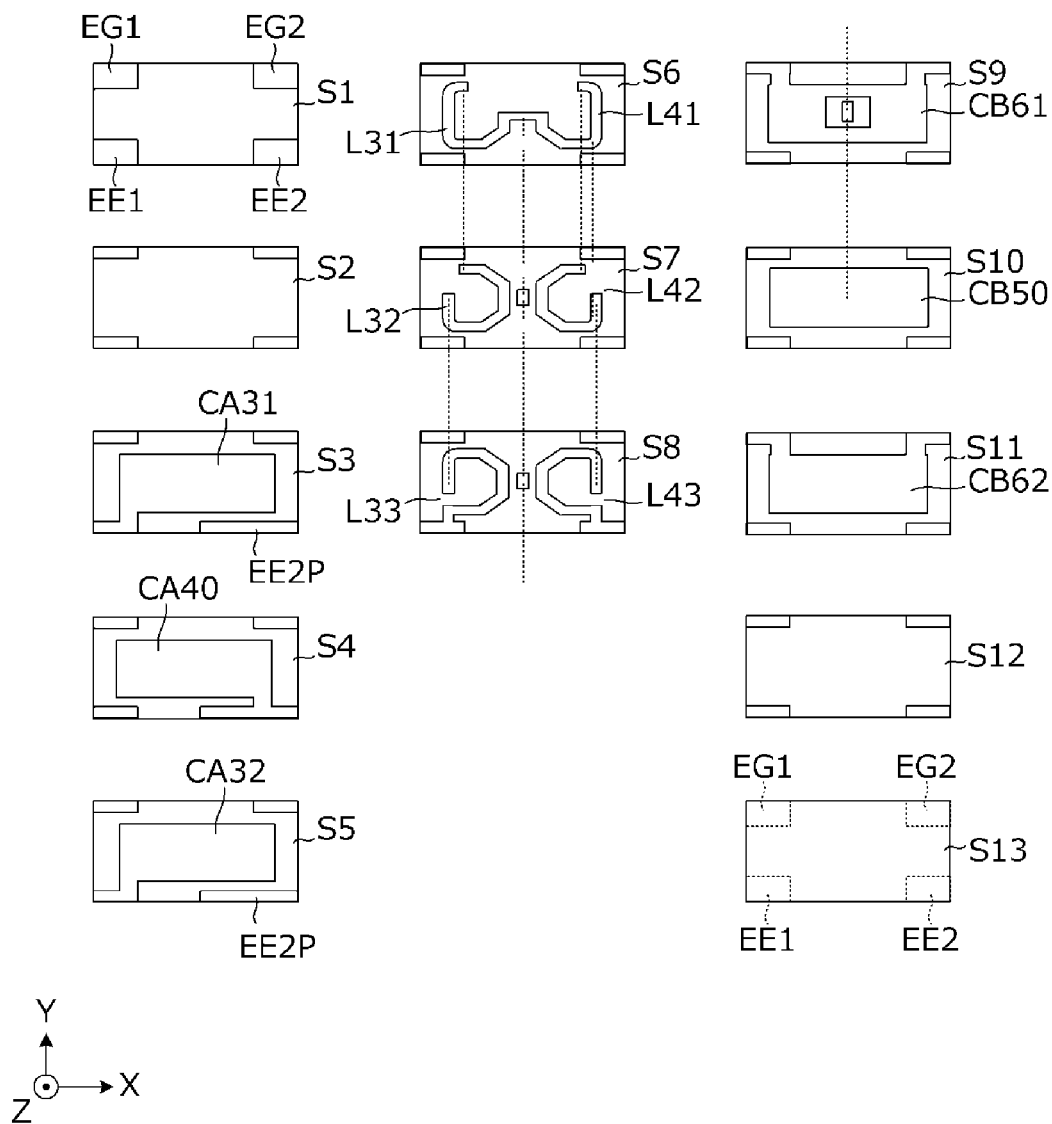
FIG. 15 is an exploded plan view illustrating conductor patterns provided on insulating substrates of the circuit element 102B.

FIG. 15 is an exploded plan view illustrating conductor patterns provided on insulating substrates of the circuit element 102B. An insulating substrate S1 is an uppermost insulating substrate and an insulating substrate S13 is a lowermost insulating substrate. Insulating substrates S2 to S12 are disposed therebetween. The first outer electrode EE1, the second outer electrode EE2, and the ground electrodes EG1 and EG2 are provided on the upper surface of the insulating substrate S1 and the lower surface of the insulating substrate S13. As illustrated in FIG. 14, the first outer electrode EE1, the second outer electrode EE2, and the ground electrodes EG1 and EG2 are also provided on the side surfaces of the multilayer body 1.

A large-width electrode EE2P that is electrically connected to the second portion SP illustrated in FIG. 14 is provided on the insulating substrate S3. The width of the large-width electrode EE2P in a direction parallel or substantially parallel to the X axis is the same or substantially the same as the width of the second portion SP. Since the large-width electrode EE2P and the second portion SP and the third capacitor electrodes CA31 and CA32 face each other across a large width in this way, an additional capacitance having a prescribed size is generated therebetween.

In the Second Preferred Embodiment, the large-width electrode EE2P and the second portion SP are provided at positions facing capacitor electrodes and are not provided at positions facing the third coil conductors L31, L32, and L33 and the fourth coil conductors L41, L42, and L43. This reduces or prevents unwanted parasitic capacitances.

Third Preferred Embodiment

In a Third Preferred Embodiment of the present invention, an example of an LC filter in which an additional capacitance is shunt connected is described.

Figure 16:
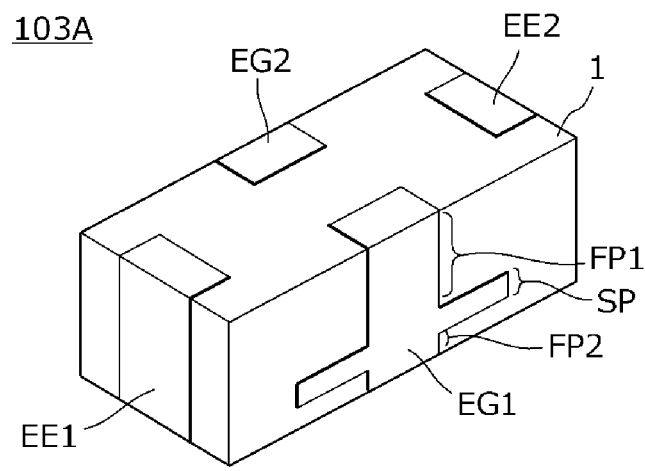
FIG. 16 is a perspective view of a circuit element 103A according to a Third Preferred Embodiment of the present invention.
Figure 16:
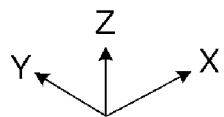

FIG. 16 is a perspective view of a circuit element 103A according to the Third Preferred Embodiment. The circuit element 103A includes a rectangular-parallelepiped-shaped multilayer body 1 in which a plurality of insulating substrates are stacked. A first outer electrode EE1, a second outer electrode EE2, and ground electrodes EG1 and EG2 are provided on outer surfaces of the multilayer body 1.

The second outer electrode EE2 includes first portions FP1 and FP2 and a second portion SP that have different widths from each other in a layer direction of the insulating substrates (width in direction parallel or substantially parallel to X axis in example illustrated in FIG. 16). The width of the second portion SP is larger than the widths of the first portions FP1 and FP2. The second portion SP faces the sides of some capacitor electrodes described later.

Figure 17:
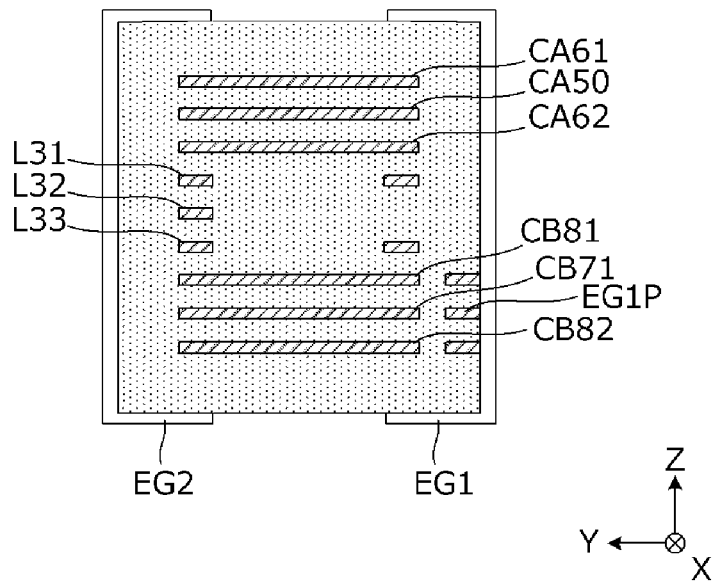
FIG. 17 is a sectional view taken along a plane that is parallel or substantially parallel to a Y-Z plane and passes through the center of the circuit element 103A.

FIG. 17 is a sectional view taken along a plane (one-dot dashed line in FIG. 18 described later) that is parallel or substantially parallel to the Y-Z plane and passes through seventh capacitor electrode CB71, which is described later, of the circuit element 103A. Capacitor electrodes CA61, CA50, and CA62 and capacitor electrodes CB81, CB90, and CB82 are provided inside the multilayer body.

Figure 18:
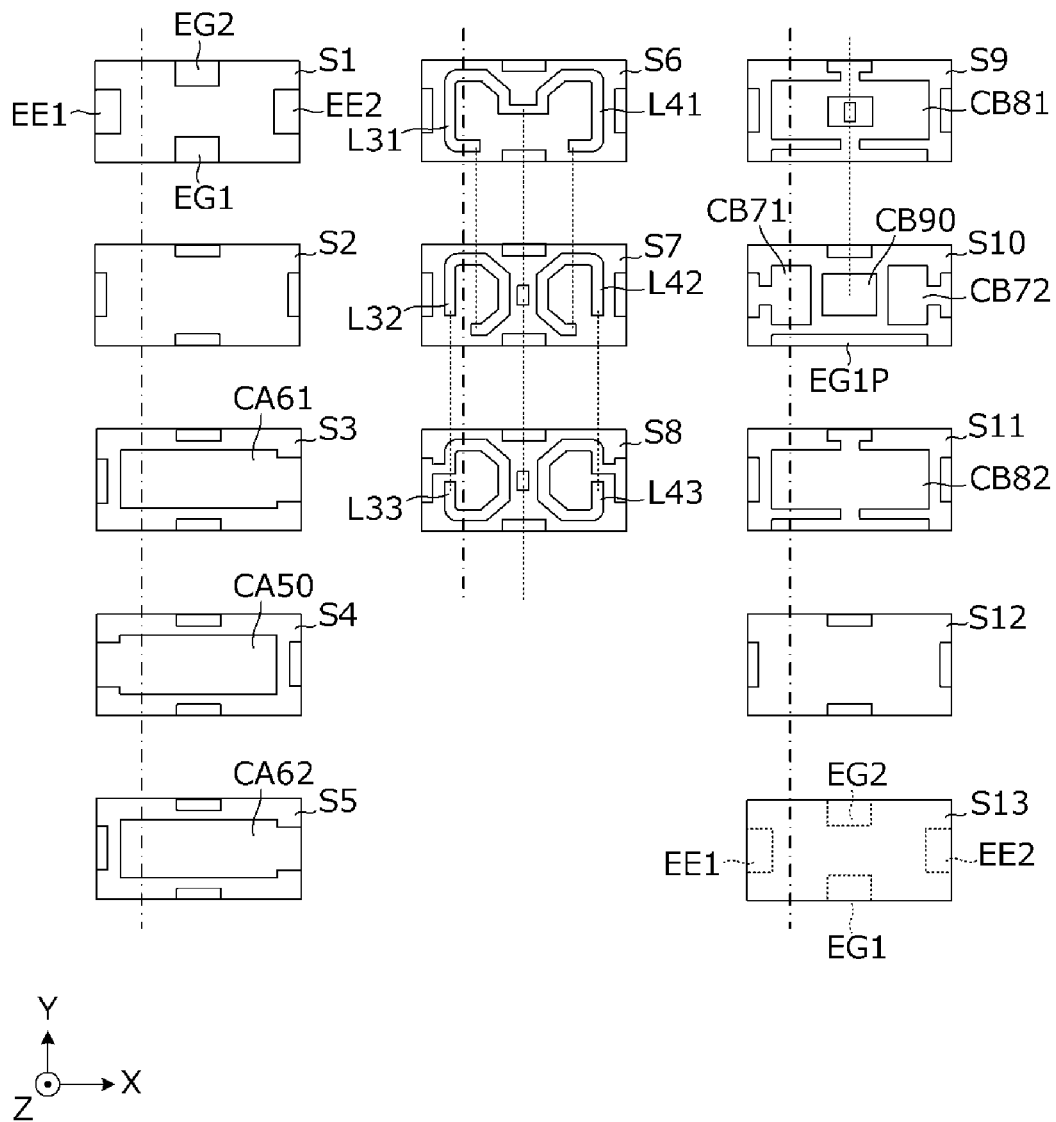
FIG. 18 is an exploded plan view illustrating conductor patterns provided on insulating substrates of the circuit element 103A.

FIG. 18 is an exploded plan view illustrating conductor patterns provided on insulating substrates of the circuit element 103A. An insulating substrate S1 is an uppermost insulating substrate and an insulating substrate S13 is a lowermost insulating substrate. Insulating substrates S2 to S12 are disposed therebetween. The first outer electrode EE1, the second outer electrode EE2, and the ground electrodes EG1 and EG2 are provided on the upper surface of the insulating substrate S1 and the lower surface of the insulating substrate S13. As illustrated in FIG. 16, the first outer electrode EE1, the second outer electrode EE2, and the ground electrodes EG1 and EG2 are also provided on the four side surfaces of the multilayer body 1.

Capacitor electrodes CA61 and CA62 are respectively provided on the insulating substrates S3 and S5 and a capacitor electrode CA50 is provided on the insulating substrate S4. The capacitor electrodes CA61 and CA62 are connected to the second outer electrode EE2 and the capacitor electrode CA50 is connected to the first outer electrode EE1.

In addition, capacitor electrodes CB81 and CB82 are provided on the insulating substrates S9 and S11 and capacitor electrodes CB90, CB71, and CB72 are provided on the insulating substrate S10. The capacitor electrodes CB81 and CB82 are both connected to the ground electrodes EG1 and EG2.

The third coil conductors L31, L32, and L33 are respectively provided on the insulating substrates S6, S7, and S8. In addition, similarly, the fourth coil conductors L41, L42, and L43 are respectively provided on the insulating substrates S6, S7, and S8. A first end of the third coil conductor L31 is connected to the capacitor electrode CB90 through a via conductor and conductor patterns located at the position where the via conductor is provided. A via conductor, which connects a second end of the third coil conductor L31 and a first end of the third coil conductor L32 to each other, is provided in the insulating substrate S6. A via conductor, which connects a second end of the third coil conductor L32 and a first end of the third coil conductor L33 to each other, is provided in the insulating substrate S7. A second end of the third coil conductor L33 is connected to the first outer electrode EE1. A third coil L3 includes the third coil conductors L31, L32, and L33 and the via conductors. Similarly, a fourth coil L4 includes the fourth coil conductors L41, L42, and L43 and the via conductors.

A large-width electrode EG1P that is electrically connected to the second portion SP illustrated in FIG. 16 is provided on the insulating substrate S10. The width of the large-width electrode EG1P in a direction parallel or substantially parallel to the X axis is the same or substantially the same as the width of the second portion SP. Since the large-width electrode EG1P and the second portion SP and the capacitor electrodes CB71 and CB72 face each other across a large width in this way, an additional capacitance having a prescribed size is generated therebetween.

Figure 19:
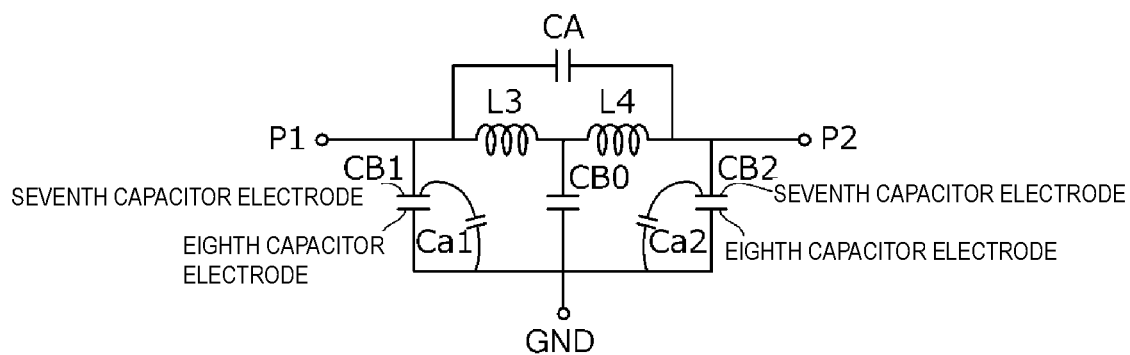
FIG. 19 is a circuit diagram of the circuit element 103A.

FIG. 19 is a circuit diagram of the circuit element 103A. The circuit element 103A includes the third coil L3 including the third coil conductors L31, L32, and L33 and the fourth coil L4 including the fourth coil conductors L41, L42, and L43. In addition, the circuit element 103A includes a capacitor CB0 including the eighth capacitor electrodes CB81 and CB82 and the capacitor electrode CB90, capacitors CB1 and CB2 including the eighth capacitor electrodes CB81 and CB82 and the seventh capacitor electrodes CB71 and CB72, and a capacitor CA including the fifth capacitor electrode CA50 and the sixth capacitor electrodes CA61 and CA62. The port P1 corresponds to the first outer electrode EE1 and the port P2 corresponds to the second outer electrode EE2. In addition, a ground GND corresponds to the ground electrodes EG1 and EG2.

An additional capacitance Ca1 is generated between the first port P1 and ground and an additional capacitance Ca2 is generated between the second port P2 and ground. Therefore, the additional capacitances Ca1 and Ca2 are respectively connected in parallel with the capacitors CB1 and CB2 and the capacitances of the capacitors CB1 and CB2 are increased by the additional capacitances Ca1 and Ca2.

Figure 20:
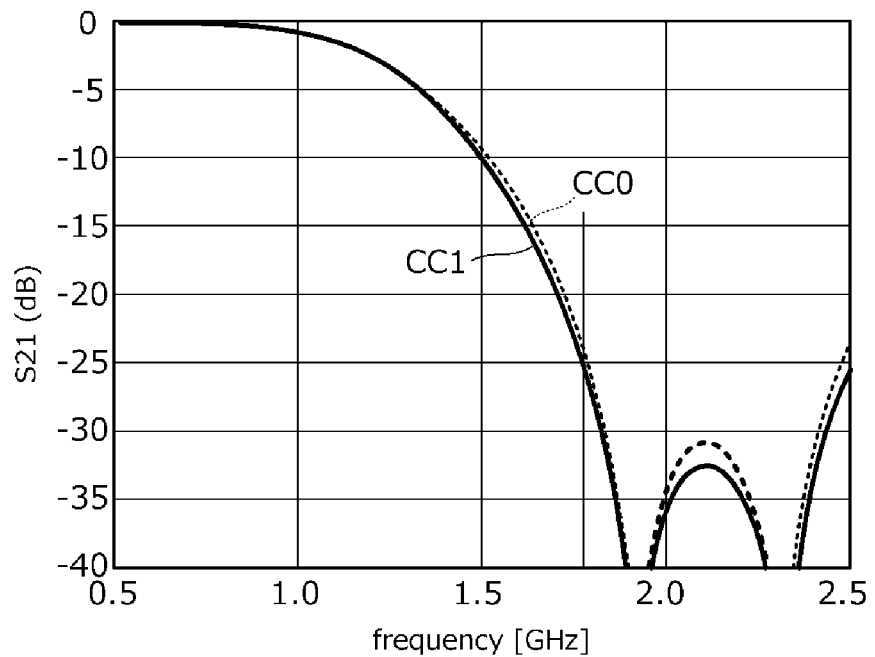
FIG. 20 is a diagram illustrating the frequency characteristics of the pass amplitude of the circuit element 103A.

FIG. 20 is a diagram illustrating the frequency characteristics of the pass amplitude of the circuit element 103A. The circuit illustrated in FIG. 19 operates as a low pass filter. In FIG. 20, the horizontal axis represents frequency and the vertical axis represents pass amplitude, and a characteristic curve CC1 represents the characteristic of the circuit element 103A of the present preferred embodiment and a characteristic curve CC0 represents the characteristic of a circuit element of a comparative example that does not include the additional capacitances Ca1 and Ca2. Compared to the comparative example, in the circuit element 103A of the present preferred embodiment, the pass amplitude in the vicinity of 1.78 GHz is reduced.

Figure 21:
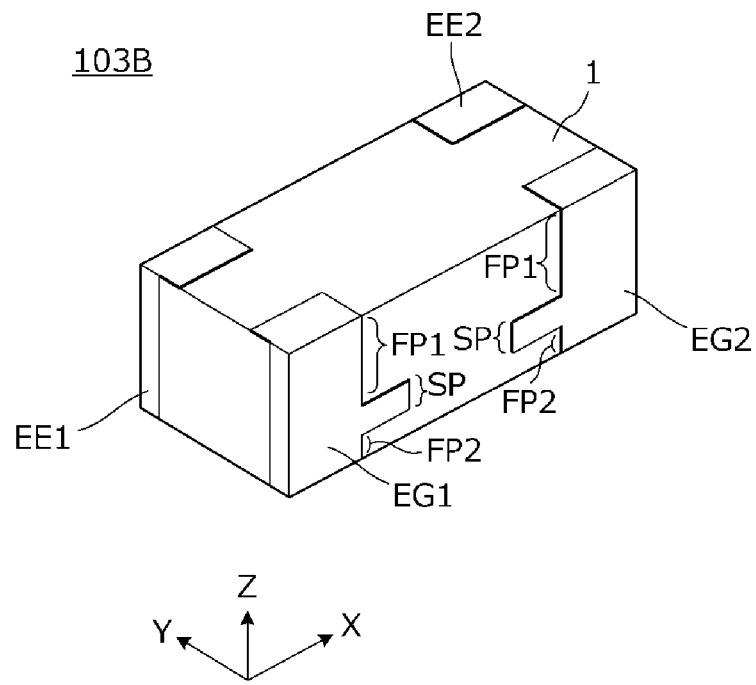
FIG. 21 is a perspective view of a circuit element 103B according to a Third Preferred Embodiment of the present invention that is different from the example illustrated in FIG. 16.

FIG. 21 is a perspective view of a circuit element 103B according to a Third Preferred Embodiment of the present invention that is different from the example illustrated in FIG. 16. The circuit element 103B includes a rectangular-parallelepiped-shaped multilayer body 1 in which a plurality of insulating substrates are stacked. A first outer electrode EE1, a second outer electrode EE2, and ground electrodes EG1 and EG2 are provided at the corners of side surfaces of the outer surfaces of the multilayer body 1.

The ground electrodes EG1 and EG2 include first portions FP1 and FP2 and second portions SP that have different widths from each other in a layer direction of the insulating substrates (width in direction parallel or substantially parallel to X axis in example illustrated in FIG. 21). The width of the second portion SP is larger than the widths of the first portions FP1 and FP2. The second portion SP faces some capacitor electrodes described later.

Figure 22:
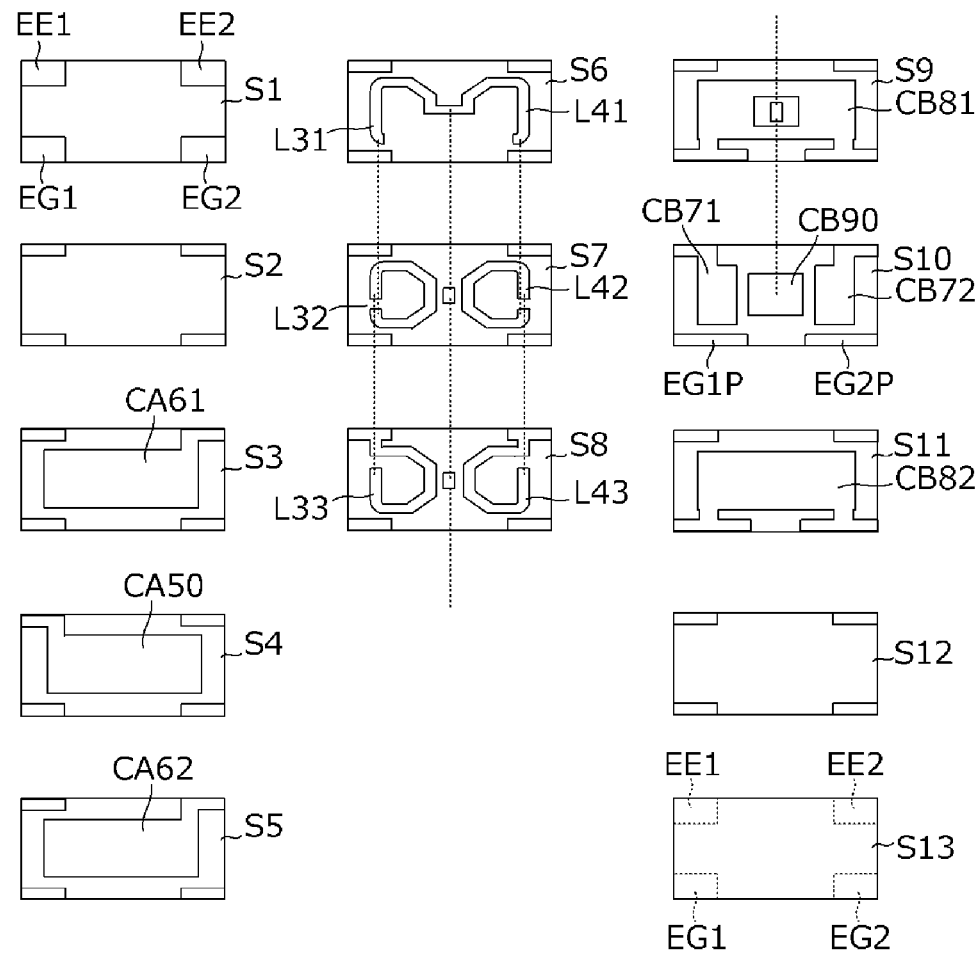
FIG. 22 is an exploded plan view illustrating conductor patterns provided on insulating substrates of the circuit element 103B.

FIG. 22 is an exploded plan view illustrating conductor patterns provided on insulating substrates of the circuit element 103B. An insulating substrate S1 is an uppermost insulating substrate and an insulating substrate S13 is a lowermost insulating substrate. Insulating substrates S2 to S12 are disposed therebetween. The first outer electrode EE1, the second outer electrode EE2, and the ground electrodes EG1 and EG2 are provided on the upper surface of the insulating substrate S1 and the lower surface of the insulating substrate S13. As illustrated in FIG. 21, the first outer electrode EE1, the second outer electrode EE2, and the ground electrodes EG1 and EG2 are also provided on the side surfaces of the multilayer body 1.

Large-width electrodes EG1P and EG2P that are electrically connected to the second part SP illustrated in FIG. 21 are provided on the insulating substrate S10. The remainder of the conductor patterns provided on the insulating substrates S1 to S13 are the same or substantially the same as those in the example illustrated in FIG. 18.

Thus, a preferred embodiment of the present invention can also be similarly applied to structures where the outer electrodes and ground electrodes are formed at the corners of the side surfaces of the outer surfaces of the multilayer body 1.

Fourth Preferred Embodiment

Figure 23:
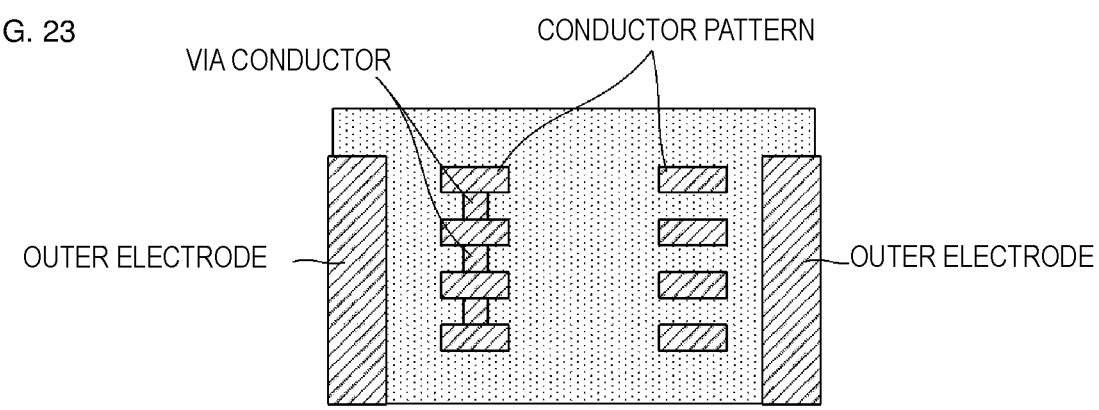
FIG. 23 is an outline sectional view of a circuit element illustrated for an example of a method of manufacturing conductor patterns and a multilayer body.

In a Fourth Preferred Embodiment of the present invention, a non-limiting example of a method of manufacturing conductor patterns and a multilayer body will be described. In the method, a multilayer body is formed by repeatedly applying a conductive paste and an insulating paste to insulating substrates using a screen printing method and then stacking the insulating substrates. FIG. 23 is an outline sectional view of a circuit element manufactured using a method of manufacturing described next.

Specifically, the circuit element is manufactured as described below.

(1) First, insulating layers are formed by repeatedly applying an insulating paste using screen printing, for example.

(2) Next, conductive paste layer patterns are formed by applying a photosensitive conductive paste using, for example, screen printing, radiating ultraviolet light, and developing the applied paste using an alkaline solution.

(3) A photosensitive insulating paste is applied using, for example, screen printing to form photosensitive insulating layers, and the photosensitive insulating layers are irradiated with ultraviolet light and developed using an alkaline solution. Openings for the outer electrodes and via holes are formed in this way.

(4) Outer electrode conductive layers are formed inside the openings for the outer electrodes, via conductors are formed inside the via holes, and conductor pattern are formed on the surfaces.

A mother multilayer body is obtained by repeating the above steps (2) to (4).

The terminals of the circuit element are formed of a plurality of stacked terminal conductor patterns formed by repeating the above steps, and therefore all of the insulating substrates are provided with terminal conductor patterns.

The method of forming the conductor patterns is not limited to the above-described method, and for example, a method in which a conductive paste is applied by performing printing using screen plates including openings in the shape of conductor patterns and then the resulting layers are stacked may be used. In addition, the method of forming the outer electrodes is not limited to the above-described method, and for example, terminal electrodes may be formed by dipping or sputtering of a conductor paste onto a multilayer body, and the surfaces of the terminal electrodes may then be plated.

Fifth Preferred Embodiment

In a Fifth Preferred Embodiment of the present invention, several examples of applications of an additional capacitance that are different from the examples described thus far will be described.

Figure 24:
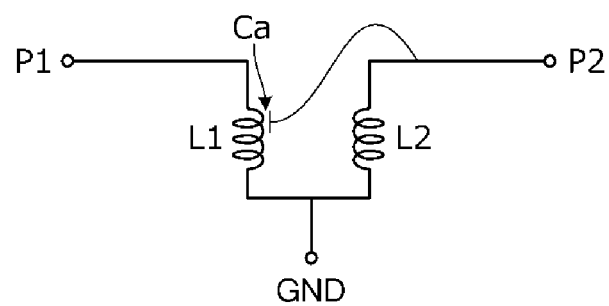
FIG. 24 is a circuit diagram of a circuit element according to a Fifth Preferred Embodiment of the present invention.

FIG. 24 is a circuit diagram of a circuit element according to a Fifth Preferred Embodiment of the present invention. This circuit element includes a first coil L1 including first coil conductors and a second coil L2 including second coil conductors. In addition, an additional capacitance Ca generated between the second outer electrode and the first coil conductors is provided.

The additional capacitance Ca is generated between the second port P2 and the first coil L1. In the present preferred embodiment, the capacitor C illustrated in FIG. 4 is provided by the additional capacitance Ca. In addition, in this example, the first coil L1 and the second coil L2 are not magnetically coupled with each other.

FIGS. 25A to 25D are circuit diagrams of other circuit elements according to a Fifth Preferred Embodiment of the present invention different from the example illustrated in FIG. 24.

Figure 25A:
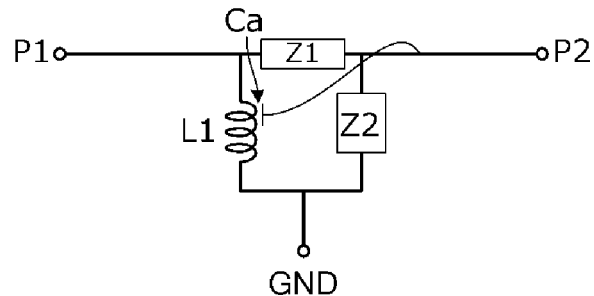
FIGS. 25A to 25D are circuit diagrams of other circuit elements according to a Fifth Preferred Embodiment of the present invention that is different from the example illustrated in FIG. 24.

The circuit element illustrated in FIG. 25A includes a first coil L1 including first coil conductors and impedance elements Z1 and Z2 including conductor patterns. A port P1 corresponds to a first outer electrode and a port P2 corresponds to a second outer electrode. In addition, a ground GND corresponds to a ground electrode. This circuit element includes an additional capacitance Ca generated between the second outer electrode and the first coil conductors. The impedance elements Z1 and Z2 are inductors, capacitors, or the like.

Figure 25B:
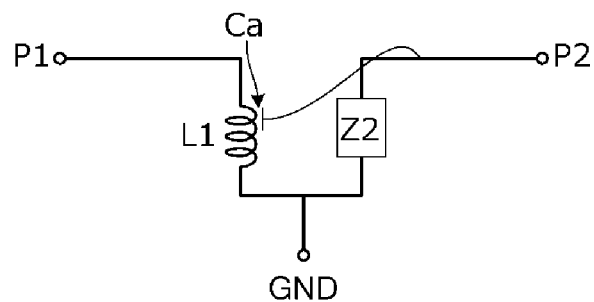
Figure 25C:
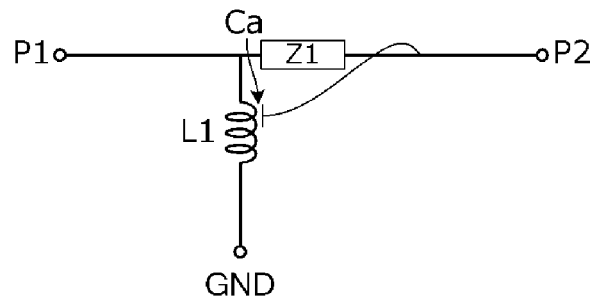
Figure 25D:
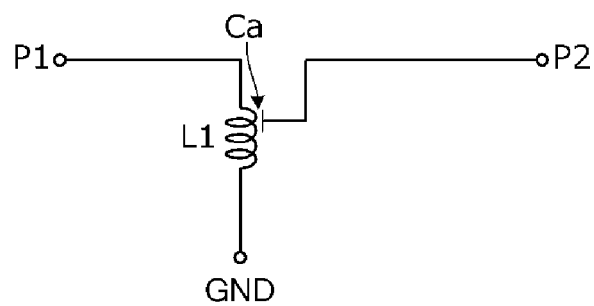

The circuit element illustrated in FIG. 25B represents a case in which the impedance element Z1 in FIG. 25A is in an open state. The circuit element illustrated in FIG. 25C represents a case in which the impedance element Z2 in FIG. 25A is in an open state. In addition, the circuit element illustrated in FIG. 25D represents a case where the impedance elements Z1 and Z2 in FIG. 25A are both in an open state.

Figure 26A:
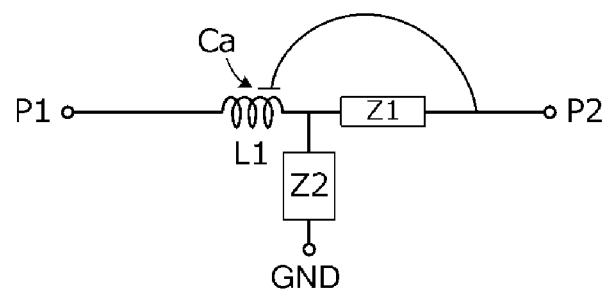
FIGS. 26A and 26B are circuit diagrams of other circuit elements according to a Fifth Preferred Embodiment of the present invention.
Figure 26B:
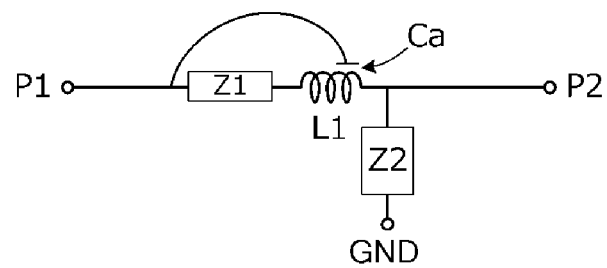

FIGS. 26A and 26B are other circuit diagrams of circuit elements according to a Fifth Preferred Embodiment of the present invention. The circuit elements illustrated in FIGS. 26A and 26B both include a first coil L1 including first coil conductors and impedance elements Z1 and Z2 including prescribed conductor patterns. The impedance elements Z1 and Z2 are inductors, capacitors, or the like.

A port P1 corresponds to a first outer electrode and a port P2 corresponds to a second outer electrode. In addition, a ground GND corresponds to a ground electrode. In both of the circuit elements illustrated in FIGS. 26A and 26B, the first coil L1 is connected in series with a signal line between the port P1 and the port P2. An additional capacitance Ca generated between the second outer electrode and the first coil conductors is provided.

Thus, a preferred embodiment of the present invention can also be applied to a circuit in which an additional capacitance is connected to the first coil that is connected in series with the signal line.

Figure 27:
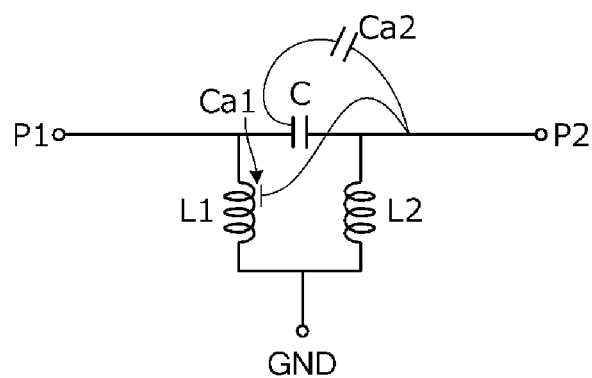
FIG. 27 is a circuit diagram of another circuit element according to a Fifth Preferred Embodiment of the present invention.

FIG. 27 is another circuit diagram of a circuit element according to a Fifth Preferred Embodiment of the present invention. This circuit element includes a first coil L1 including first coil conductors, a second coil L2 including second coil conductors, and a capacitor C including a first capacitor electrode and a second capacitor electrode. A port P1 corresponds to a first outer electrode and a port P2 corresponds to a second outer electrode. In addition, a ground GND corresponds to a ground electrode. An additional capacitance Ca1 is a capacitance generated between the second outer terminal and the first coil conductors and an additional capacitance Ca2 is a capacitance generated between the first capacitor electrode and the second outer electrode.

The additional capacitance Ca2 can be provided by a large-width portion of the second outer electrode EE2 illustrated in FIGS. 2 and 3 at a position facing the capacitor electrodes C11 and C12.

Thus, a plurality of additional capacitances may be provided.

Finally, the descriptions of the above preferred embodiments are illustrative in all points and are not restrictive. A person skilled in the art can make modifications and changes as appropriate. The scope of the present invention is defined by the following claims rather than by the above-described preferred embodiments. In addition, changes from the preferred embodiments, the changes being within the scope of equivalents that are within the scope of the claims, are included in the scope of the present invention.

For example, in the above-described preferred embodiments, a circuit element has been described that includes capacitor conductor patterns, first coil conductor patterns, and second coil conductor patterns and that operates as a phase shifter or a filter, but the present invention can be also similarly applied to an LC composite component in which a coil and a capacitor are provided inside a single multilayer body when an inductor and a capacitor are configured as a single component in an impedance matching circuit including an inductor and a capacitor and so on.

In each of the preferred embodiments described above, a circuit element in which a ground electrode is provided on an outer surface of a multilayer body has been described, but the present invention can be similarly applied to a circuit element that does not have a ground electrode formed on an outer surface of the multilayer body.

Representative features disclosed by the above-described preferred embodiments of the present invention will be described below.

(1) A circuit element includes a multilayer body 1 including insulating substrates, first coil conductors L11 to L14 inside the multilayer body 1; and a first outer electrode EE1 and a second outer electrode EE2 on outer surfaces of the multilayer body 1. The first coil conductors L11 to L14 include winding axes in a stacking direction of the insulating substrates. The first coil conductors L11 to L14 are connected to the first outer electrode EE1 or the second outer electrode EE2. The second outer electrode EE2 extend along a side surface of the multilayer body 1. An additional capacitance Ca is generated between the second outer electrode EE2 and the first coil conductors L11 to L14 due to the second outer electrode EE2 and the first coil conductors L11 to L14 being adjacent to or in a vicinity of each other.

This configuration enables fine adjustments to be made to a desired capacitance by generating an additional capacitance without increasing the number of insulating substrate layers and without securing areas in which to define capacitor electrodes on the insulating substrates, and therefore a small-sized circuit element that is suitable for increasing the density of high-frequency circuits can be obtained.

(2) The circuit element further includes a ground electrode EG1 on an outer surface of the multilayer body 1, and second coil conductors L21 to L24 inside the multilayer body 1. A first end of a first coil L1 including the first coil conductors L11 to L14 is connected to the first outer electrode EE1. A second end of the first coil L1 is connected to the ground electrode EG1. A first end of a second coil L2 including the second coil conductors L21 to L24 is connected to the second outer electrode EE2. A second end of the second coil L2 is connected to the ground electrode EG1. (First Preferred Embodiment and so on) With this configuration, a preferred embodiment of the present invention can be applied to a circuit equipped with two coils that are magnetically coupled with each other as illustrated in FIG. 4 and so on.

(3) The circuit element further includes first capacitor electrodes C11 and C12 and second capacitor electrodes C21 and C22 that are provided inside the multilayer body 1 and face each other. The first capacitor electrodes C11 and C12 are connected to the first outer electrode EE1 and the second capacitor electrodes C21 and C22 are connected to the second outer electrode EE2. (First Preferred Embodiment and so on) As illustrated in FIG. 4 and so on, this configuration enables the capacitance of a capacitor connected between the first outer electrode EE1 and the second outer electrode EE2 to be increased by an additional capacitance.

(4) The second outer electrode EE2 includes first portions FP1 and FP2 and a second portion SP that have different widths from each other in a layer direction of the insulating substrates. The width of the second portion SP is larger than the widths of the first portions FP1 and FP2. The second portion SP and at least a portion of the first coil conductors L11 to L14 are located at the same or substantially the same height in a stacking direction of the insulating substrates in the multilayer body 1. (First Preferred Embodiment and so on) This configuration enables an additional capacitance to be easily generated between the second outer electrode EE2 and a prescribed portion of the first coil conductors.

(5) The first coil conductors L11 to L14 are provided across a plurality of layers and the second portion SP is provided within a range of about ½ the height of the multilayer body 1 in the stacking direction of the insulating substrates. (First Preferred Embodiment and so on) This enables unwanted capacitances generated between the second outer electrode EE2 and the first coil conductors to be reduced or prevented.

(6) A circuit element includes a multilayer body 1 including insulating substrates, third capacitor electrodes CA31 and CA32 and a fourth capacitor electrode CA40 provided inside the multilayer body 1 and that face each other, and a first outer electrode EE1 and a second outer electrode EE2 provided on outer surfaces of the multilayer body 1. The third capacitor electrodes CA31 and CA32 or the fourth capacitor electrode CA40 are connected to the first outer electrode EE1, the second outer electrode EE2, or the ground electrodes EG1 and EG2. The second outer electrode EE2 extends along a side surface of the multilayer body 1. An additional capacitance Ca is generated between the second outer electrode EE2 and the third capacitor electrodes CA31 and CA32 due to the second outer electrode EE2 and the third capacitor electrodes CA31 and CA32 being adjacent to or in a vicinity of each other. The second outer electrode EE2 includes first portions FP1 and FP2 and a second portion SP that have different widths from each other in a layer direction of insulating substrates S1 to S17. The width of the second portion SP is larger than the width of the first portions FP1 and FP2. (Second Preferred Embodiment and so on)

This configuration enables an additional capacitance to be generated without increasing the number of insulating substrate layers and without securing areas in which to provide capacitor electrodes on the insulating substrates, and therefore a small-sized circuit element that is suitable for increasing the density of high-frequency circuits can be obtained.

(7) The second portion SP and at least a portion of the third capacitor electrodes CA31 and CA32 are located at the same or substantially the same height in a stacking direction of the insulating substrates in the multilayer body 1 (Second Preferred Embodiment and so on). This configuration enables an additional capacitance to be easily generated between the second outer electrode EE2 and a prescribed portion of the third capacitor electrodes CA31 and CA32.

(8) The circuit element further includes third coil conductors L31 to L33 and fourth coil conductors L41 to L43 that are provided inside the multilayer body 1 and are connected in series between the first outer electrode EE1 and the second outer electrode EE2, a fifth capacitor electrode CB50 that is provided inside the multilayer body 1 and is electrically connected to a connection portion between a third coil L3 including the third coil conductors L31 to L33 and a fourth coil L4 including the fourth coil conductors L41 to L43, and sixth capacitor electrodes CB61 and CB62 that are provided inside the multilayer body 1, face the fifth capacitor electrode CB50, and are electrically connected to a ground electrode. (Second Preferred Embodiment and so on) With this configuration, as illustrated in FIG. 12, a circuit element that operates as an LC low pass filter can be obtained.

(9) A circuit element includes a multilayer body 1 including insulating substrates; a first outer electrode EE1, a second outer electrode EE2, and ground electrodes EG1 and EG2 provided on outer surfaces of the multilayer body 1, a seventh capacitor electrode CB71 and eighth capacitor electrodes CB81 and CB82 that are provided inside the multilayer body 1 and that face each other; and third coil conductors L31 to L33 and fourth coil conductors L41 to L43 provided inside the multilayer body 1. A third coil L3 including the third coil conductors L31 to L33 and a fourth coil L4 including the fourth coil conductors L41 to L43 are connected in series between the first outer electrode EE1 and the second outer electrode EE2. The eighth capacitor electrodes CB81 and CB82 are connected to the ground electrodes EG1 and EG2. The seventh capacitor electrode CB71 is connected to the first outer electrode EE1. The ground electrode EG1 extends along a side surface of the multilayer body 1. An additional capacitance Ca1 is generated between the seventh capacitor electrode CB71 and the ground electrode EG1 due to the ground electrode EG1 and the seventh capacitor electrode CB71 being adjacent to or in a vicinity of each other. In the Third Preferred Embodiment, an additional capacitance Ca2 is generated between a seventh capacitor electrode CB72 and the ground electrode EG1. The second outer electrode EE2 includes first portions FP1 and FP2 and a second portion SP that have different widths from each other in a layer direction of the insulating substrates S1 to S17. The width of the second portion SP is larger than the widths of the first portions FP1 and FP2. (Third Preferred Embodiment and so on) With this configuration, a shunt-connection capacitor can be provided in a first stage or a second stage of an LC filter circuit.

(10) The ground electrodes EG1 and EG2 each include first portions FP1 and FP2 and a second portion SP that have different widths from each other in a layer direction of the insulating substrates. The width of the second portion SP is larger than the widths of the first portions FP1 and FP2. The second portion SP and at least a portion of the seventh capacitor electrode CB71 (CB72) are located at the same or substantially the same height in a stacking direction of the insulating substrates in the multilayer body 1. (Third Preferred Embodiment and so on) This configuration enables an additional capacitance to be easily generated between the ground electrode EG1 and the seventh capacitor electrode CB71 (CB72).

(11) The first portion FP1 is provided at a low-height position from a mounting surface of the multilayer body on a circuit board that is a mounting destination and the second portion SP is provided at a high-height position from the mounting surface of the multilayer body on the circuit board that is the mounting destination. (First, Second Preferred Embodiments, and so on) With this configuration, unwanted adhesion of solder (wetting of solder fillet) to the second portion is reduced or prevented when mounting the circuit element on a circuit board using a reflow solder method or the like.

(12) The second portion SP protrudes in a layer direction of the insulating substrates from both sides of the first portion FP1. With this configuration, the distance between the protruding edges of the protruding portions and adjacent electrodes is prevented from becoming too small compared to a shape where a protruding portion protrudes in the layer direction from only one side of the first portion FP1, and unwanted parasitic capacitances and solder bridges are reduced or prevented.

(13) The multilayer body 1 has a rectangular or substantially rectangular parallelepiped shape. The second outer electrode EE2 has an asymmetrical shape about the center of the multilayer body 1 with respect to an electrode provided at a position on the outer surface of the multilayer body 1 on the opposite side of the multilayer body 1. This configuration enables the second outer electrode EE2 to define and function as a direction identification mark, thus making it unnecessary to provide a special direction identification mark, and a reduction in cost can be achieved.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. A circuit element comprising:
a multilayer body including insulating substrates;
a first coil conductor inside the multilayer body; and
a first outer electrode and a second outer electrode on an outer surface of the multilayer body; wherein
the first coil conductor includes a winding axis extending in a stacking direction of the insulating substrates;
the first coil conductor is connected to the first outer electrode or the second outer electrode;
the second outer electrode extends along a side surface of the multilayer body;
an additional capacitance is generated between the second outer electrode and the first coil conductor due to the second outer electrode and the first coil conductor being adjacent to or in a vicinity of each other;
the second outer electrode includes a first portion and a second portion having different widths from each other in a layer direction of the insulating substrates; and
the width of the second portion is larger than the width of the first portion.

2. The circuit element according to claim 1, further comprising:
a ground electrode on the outer surface of the multilayer body; and
a second coil conductor inside the multilayer body; wherein
a first end of a first coil including the first coil conductor is connected to the first outer electrode and a second end of the first coil is connected to the ground electrode; and
a first end of a second coil including the second coil conductor is connected to the second outer electrode and a second end of the second coil is connected to the ground electrode.

3. The circuit element according to claim 2, further comprising:
a first capacitor electrode and a second capacitor electrode inside the multilayer body and facing each other; wherein
the first capacitor electrode is connected to the first outer electrode and the second capacitor electrode is connected to the second outer electrode.

4. The circuit element according to claim 1, wherein the second portion and at least a portion of the first coil conductor are located at a same or substantially a same height in a stacking direction of the insulating substrates in the multilayer body.

5. The circuit element according to claim 4, wherein the second portion is located within a range of about ½ of a height of the multilayer body in a stacking direction of the insulating substrates.

6. A circuit element comprising:
a multilayer body including insulating substrates;
a third capacitor electrode and a fourth capacitor electrode inside the multilayer body and facing each other; and
a first outer electrode and a second outer electrode on an outer surface of the multilayer body; wherein
the third capacitor electrode or the fourth capacitor electrode is connected to the first outer electrode or the second outer electrode;
the second outer electrode extends along a side surface of the multilayer body;
an additional capacitance is generated between the second outer electrode and the third capacitor electrode due to the second outer electrode and the third capacitor electrode being adjacent to or in a vicinity of each other;
the second outer electrode includes a first portion and a second portion that have different widths from each other in a layer direction of the insulating substrates; and
the width of the second portion is larger than the width of the first portion.

7. The circuit element according to claim 6, wherein the second portion and at least a portion of the third capacitor electrode are located at a same or substantially a same height in a stacking direction of the insulating substrates in the multilayer body.

8. The circuit element according to claim 6, further comprising:
a ground electrode on the outer surface of the multilayer body; and
a third coil conductor and fourth coil conductor inside the multilayer body and connected in series between the first outer electrode and the second outer electrode;
a fifth capacitor electrode inside the multilayer body and electrically connected to a connection portion between a third coil including the third coil conductor and a fourth coil including the fourth coil conductor; and
a sixth capacitor electrode inside the multilayer body, facing the fifth capacitor electrode, and electrically connected to the ground electrode.

9. A circuit element comprising:
a multilayer body including insulating substrates;
a first outer electrode, a second outer electrode, and a ground electrode on an outer surface of the multilayer body;
a seventh capacitor electrode and an eighth capacitor electrode inside the multilayer body and facing each other; and
a third coil conductor and a fourth coil conductor inside the multilayer body; wherein
a third coil including the third coil conductor and a fourth coil including the fourth coil conductor are connected in series between the first outer electrode and the second outer electrode;
the eighth capacitor electrode is connected to the ground electrode and the seventh capacitor electrode is connected to the first outer electrode;
the ground electrode extends along a side surface of the multilayer body;
an additional capacitance is generated between the seventh capacitor electrode and the ground electrode due to the ground electrode and the seventh capacitor electrode being adjacent to or in a vicinity of each other;
the second outer electrode includes a first portion and a second portion that have different widths from each other in a layer direction of the insulating substrates; and
the width of the second portion is larger than the width of the first portion.

10. The circuit element according to claim 9, wherein the second portion and at least a portion of the seventh capacitor electrode are located at a same or substantially a same height in a stacking direction of the insulating substrates in the multilayer body.

11. The circuit element according to claim 4, wherein the first portion and the second portion are respectively located at a lower-height position and a higher-height position from a mounting surface of the multilayer body on a circuit board, which is a mounting destination.

12. The circuit element according to claim 11, wherein the second portion protrudes in the layer direction from both sides of the first portion.

13. The circuit element according to claim 1, wherein
the multilayer body has a rectangular or substantially rectangular parallelepiped shape; and
the second outer electrode has an asymmetrical shape about a center of the multilayer body with respect to an electrode at a position on the outer surface of the multilayer body on an opposite side of the multilayer body.

14. The circuit element according to claim 7, wherein the first portion and the second portion are respectively located at a lower-height position and a higher-height position from a mounting surface of the multilayer body on a circuit board, which is a mounting destination.

15. The circuit element according to claim 14, wherein the second portion protrudes in the layer direction from both sides of the first portion.

16. The circuit element according to claim 6, wherein
the multilayer body has a rectangular or substantially rectangular parallelepiped shape; and
the second outer electrode has an asymmetrical shape about a center of the multilayer body with respect to an electrode located at a position on the outer surface of the multilayer body on an opposite side of the multilayer body.

17. The circuit element according to claim 10, wherein the first portion and the second portion are respectively located at a lower-height position and a higher-height position from a mounting surface of the multilayer body on a circuit board, which is a mounting destination.

18. The circuit element according to claim 17, wherein the second portion protrudes in the layer direction from both sides of the first portion.

19. The circuit element according to claim 9, wherein
the multilayer body has a rectangular or substantially rectangular parallelepiped shape; and
the second outer electrode has an asymmetrical shape about a center of the multilayer body with respect to an electrode located at a position on the outer surface of the multilayer body on an opposite side of the multilayer body.

* * * * *